US012635343B2

(12) United States Patent
Kim

(10) Patent No.: US 12,635,343 B2
(45) Date of Patent: May 19, 2026

(54) DISPLAY PANEL DISPLAY PANEL FOR REDUCING IMAGE QUALITY DEVIATION, AND ELECTRONIC DEVICE INCLUDING THE SAME

(71) Applicant: Samsung Display Co., Ltd., Yongin-si (KR)

(72) Inventor: Byungsun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 333 days.

(21) Appl. No.: 18/307,547

(22) Filed: Apr. 26, 2023

(65) Prior Publication Data

US 2023/0422555 A1 Dec. 28, 2023

(30) Foreign Application Priority Data

Jun. 27, 2022 (KR) ......................... 10-2022-0078473

(51) Int. Cl.
| | |
|---|---|
| *H01L 29/08* | (2006.01) |
| *H04M 1/02* | (2006.01) |
| *H10K 59/121* | (2023.01) |
| *H10K 59/131* | (2023.01) |

(52) U.S. Cl.
CPC ...... *H10K 59/1213* (2023.02); *H04M 1/0264* (2013.01); *H10K 59/131* (2023.02)

(58) Field of Classification Search
CPC ............ H10K 59/1213; H10K 59/131; H04M 1/0264
USPC ......................................................... 257/40
See application file for complete search history.

(56) References Cited

U.S. PATENT DOCUMENTS

| | | | |
|---|---|---|---|
| 10,194,066 B2 | 1/2019 | Jung et al. | |
| 10,304,913 B2 | 5/2019 | Choi et al. | |
| 11,217,639 B2 | 1/2022 | Baek et al. | |
| 2022/0093708 A1* | 3/2022 | Cho ..................... | H10K 50/865 |
| 2022/0139331 A1 | 5/2022 | Jang et al. | |
| 2022/0140014 A1* | 5/2022 | Shim ................... | H10K 59/121 |
| | | | 257/40 |

FOREIGN PATENT DOCUMENTS

| | | | | |
|---|---|---|---|---|
| CN | 11-1885230 A | | 11/2020 | |
| KR | 10-2016-0100025 A | | 8/2016 | |
| KR | 10-2017-0066767 A | | 6/2017 | |
| KR | 10-2020-0036137 A | | 4/2020 | |
| KR | 20210155428 A | * | 12/2021 | ........... H10K 71/166 |
| KR | 10-2022-0041286 A | | 4/2022 | |
| KR | 10-2022-0060022 A | | 5/2022 | |
| KR | 10-2022-0061338 A | | 5/2022 | |

* cited by examiner

*Primary Examiner* — Phuc T Dang
(74) *Attorney, Agent, or Firm* — Womble Bond Dickinson (US) LLP

(57) ABSTRACT

A display panel includes a substrate including a first display area, and a second display area inside the first display area and including sub-pixel circuit areas, and transmissive areas respectively at least partially surrounding the sub-pixel circuit areas, light-emitting diodes in the first display area and in the second display area, and sub-pixel circuits respectively electrically connected to ones of the light-emitting diodes in the second display area, wherein two adjacent ones of the sub-pixel circuit areas are spaced apart from each other in a first direction with a first separation area therebetween, the first separation area including one of the transmissive areas.

20 Claims, 20 Drawing Sheets

FIG. 8A

DISPLAY PANEL DISPLAY PANEL FOR REDUCING IMAGE QUALITY DEVIATION, AND ELECTRONIC DEVICE INCLUDING THE SAME

CROSS-REFERENCE TO RELATED APPLICATION

This application claims priority to, and the benefit of, Korean Patent Application No. 10-2022-0078473, filed on Jun. 27, 2022, in the Korean Intellectual Property Office, the disclosure of which is incorporated by reference herein in its entirety.

BACKGROUND

1. Field

One or more embodiments relate to a display panel, and to an electronic device including the same.

2. Description of the Related Art

A display panel is a device for visually displaying data. Recently, display panels have been widely used. As thicknesses and weights of display panels have decreased, the range of applications of display panels has increased.

To increase an area occupied by a display area, and to add various functions to the display area, research has been conducted into a display panel in which other functions as well as an image display function are added to a display area.

SUMMARY

To add various functions, a component, such as a camera or a sensor, may be included. To secure a wider display area while arranging a component, the component may overlap the display area. As a method of arranging a component, a display panel may include a transmissive area through which a wavelength, such as light or sound, may be transmitted. One or more embodiments include a display panel having the above structure, and an electronic device including the display panel.

Additional aspects will be set forth in part in the description that follows and, in part, will be apparent from the description, or may be learned by practice of the presented embodiments.

According to one or more embodiments, a display panel includes a substrate including a first display area, and a second display area inside the first display area and including sub-pixel circuit areas, and transmissive areas respectively at least partially surrounding the sub-pixel circuit areas, light-emitting diodes in the first display area and in the second display area, and sub-pixel circuits respectively electrically connected to ones of the light-emitting diodes in the second display area, wherein two adjacent ones of the sub-pixel circuit areas are spaced apart from each other in a first direction with a first separation area therebetween, the first separation area including one of the transmissive areas.

The two adjacent ones of the sub-pixel circuit areas may be respectively electrically connected to a first light-emitting diode of the light-emitting diodes that emits light of a first color, and to a second light-emitting diode of the light-emitting diodes that emits light of a second color different from the first color.

The first light-emitting diode and the second light-emitting diode may respectively overlap corresponding ones of the sub-pixel circuits respectively in the two adjacent ones of the sub-pixel circuit areas.

Corresponding ones of the sub-pixel circuits respectively in the two adjacent ones of the sub-pixel circuit areas may be electrically connected to a signal line extending across the first separation area in the first direction.

The signal line may include a data line or a scan line.

A first portion of the signal line crossing the first separation area may include a transparent conductive material.

A second portion of the signal line may include a metallic material in at least one of the two adjacent ones of the sub-pixel circuit areas, and is electrically connected to the first portion through a contact hole of at least one insulating layer between the first portion and the second portion.

The first display area may include other sub-pixel circuit areas in which other sub-pixel circuits are respectively located, two adjacent ones of the other sub-pixel circuit areas being spaced apart from each other with a second separation area therebetween.

A first shape of the first separation area and a second shape of the second separation area may be the same in a plan view.

A first proportion of the second display area occupied by the first separation area may be the same as a second proportion of the first display area occupied by the second separation area, per unit area.

The display panel may include a light-transmitting organic insulating material overlapping the transmissive areas.

A first number of first light-emitting diodes of the light-emitting diodes in the first display area and a second number of second light-emitting diodes of the light-emitting diodes in the second display area may be the same, per unit area.

According to one or more embodiments, an electronic device includes a component, and a display panel including a substrate including a first display area, and a second display area inside the first display area, overlapping the component, and including sub-pixel circuit areas, and transmissive areas respectively at least partially surrounding the sub-pixel circuit areas, light-emitting diodes in the first display area and in the second display area, and sub-pixel circuits respectively electrically connected to ones of the light-emitting diodes in the second display area, wherein two adjacent ones of the sub-pixel circuit areas are spaced apart from each other in a first direction with a first separation area therebetween, the first separation area including one of the transmissive areas.

The component may include a sensor or a camera.

The two adjacent ones of the sub-pixel circuit areas may be respectively electrically connected to a first light-emitting diode of the light-emitting diodes that emits light of a first color, and to a second light-emitting diode of the light-emitting diodes that emits light of a second color different from the first color.

The first light-emitting diode and the second light-emitting diode may respectively overlap corresponding ones of the sub-pixel circuits respectively in the two adjacent ones of the sub-pixel circuit areas.

Corresponding ones of the sub-pixel circuits respectively in the two adjacent ones of the sub-pixel circuit areas may be electrically connected to a signal line extending in the first direction across the first separation area.

A first portion of the signal line crossing the first separation area may include a transparent conductive material.

A second portion of the signal line may include a metallic material in at least one of the two adjacent ones of the sub-pixel circuit areas, and is and electrically connected to the first portion through a contact hole of at least one insulating layer between the first portion and the second portion.

The first display area may include other sub-pixel circuit areas in which other sub-pixel circuits are respectively located, two adjacent ones of the other sub-pixel circuit areas being spaced apart from each other with a second separation area therebetween.

A first shape of the first separation area and a second shape of the second separation area may be the same in a plan view.

A first proportion of the second display area occupied by the first separation area may be the same as a second proportion of the first display area occupied by the second separation area, per unit area.

BRIEF DESCRIPTION OF THE DRAWINGS

The above and other aspects of embodiments will be more apparent from the following description taken in conjunction with the accompanying drawings, in which:

FIGS. 8A and 8B are enlarged plan views illustrating a portion A of FIG. 7;

DETAILED DESCRIPTION

Figure 1:
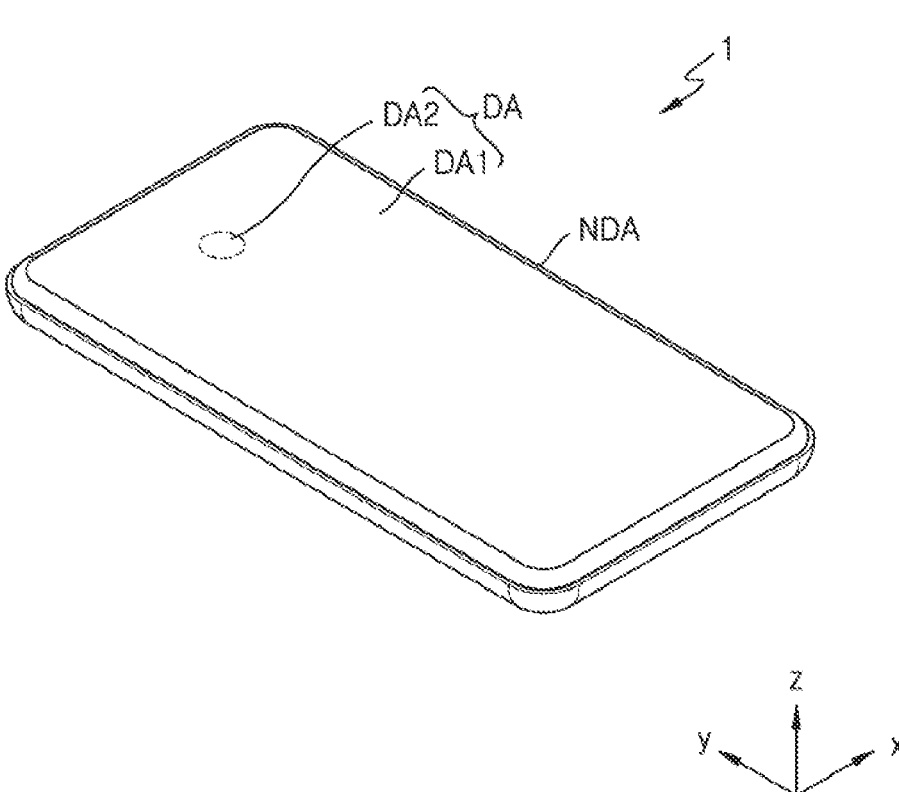
FIG. 1 is a perspective view illustrating an electronic device including a display panel, according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B.

As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating an electronic device including a display panel, according to one or more embodiments.

According to one or more embodiments, an electronic device 1 for displaying a moving image or a still image may be used as a display screen of not only a portable electronic device, such as a mobile phone, a smartphone, a tablet personal (PC) computer, a mobile communication terminal, an electronic organizer, an electronic book, a portable multimedia player (PMP), a navigation device, or an ultra-mobile PC (UMPC) but also any of various products, such as a television, a laptop computer, a monitor, an advertisement board, or an Internet of things (IoT) product. Also, the electronic device 1 according to one or more embodiments may be applied to a wearable device, such as a smart watch, a watch phone, a glasses-type display, or a head-mounted display (HMD). Also, the electronic device 1 according to one or more embodiments may be used as a center information display (CID) located on an instrument panel, a center fascia, or a dashboard of a vehicle, a room mirror display replacing a side-view mirror of a vehicle, or a display located on the back of a front seat for entertainment for a back seat of a vehicle. For convenience of explanation, the electronic device 1 is a smartphone in FIG. 1.

Referring to FIG. 1, the electronic device 1 may include a display area DA, and a non-display area NDA outside the display area DA. The electronic device 1 may provide an image through an array of sub-pixels that are two-dimensionally arranged in the display area DA.

The non-display area NDA where an image is not provided may entirely surround the display area DA. A driver or the like for applying an electrical signal or power to sub-pixels located in the display area DA may be located in the non-display area NDA. A pad to which an electronic element or a printed circuit board may be electrically connected may be located in the non-display area NDA.

The display area DA may include a first display area DA1 and a second display area DA2. The second display area DA2, where a component for adding various functions to the electronic device 1 is located, may correspond to a component area.

Figure 2:
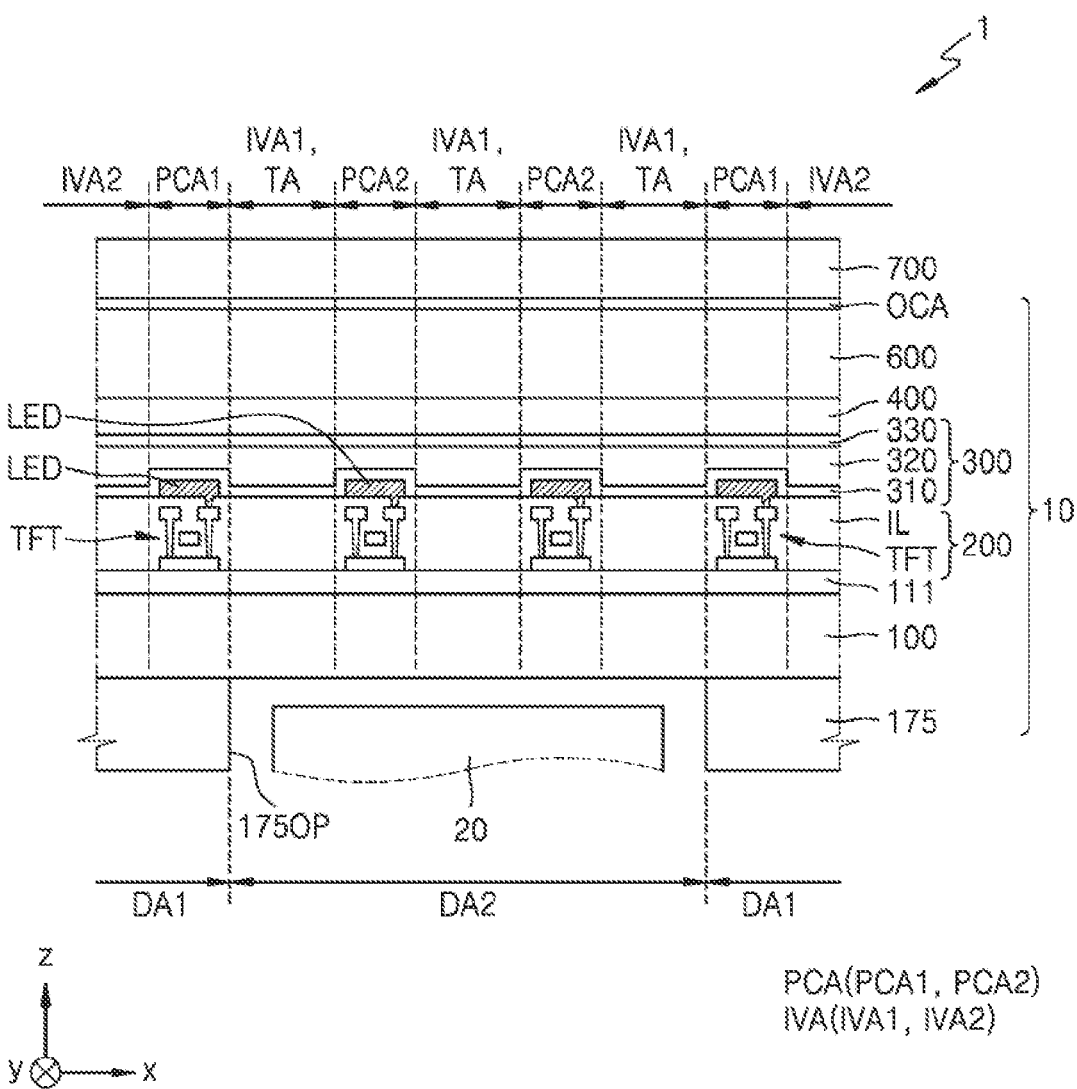
FIG. 2 is a cross-sectional view illustrating a part of an electronic device, according to one or more embodiments.

FIG. 2 is a cross-sectional view illustrating a part of an electronic device, according to one or more embodiments.

Referring to FIG. 2, the electronic device 1 may include a display panel 10, and a component 20 overlapping the display panel 10. The component 20 may be located in the second display area DA2.

The display panel 10 may include a substrate 100, a display layer 200 on the substrate 100, an encapsulation layer 300 on the display layer 200, an input sensing layer 400, an anti-reflection layer 600, and a window 700.

The substrate 100 may include glass or a polymer resin. Examples of the polymer resin of the substrate 100 may include polyethersulfone, polyacrylate, polyether imide, polyethylene naphthalate, polyethylene terephthalate, poly-phenylene sulfide, polyarylate, polyimide, polycarbonate, and cellulose acetate propionate. The substrate 100 including the polymer resin may be flexible, rollable, or bendable. The substrate 100 may have a multi-layer structure including a layer including the polymer resin and an inorganic layer, in one or more embodiments.

The display layer 200 may be located on a front surface of the substrate 100, and a lower protective film 175 may be located on a rear surface of the substrate 100. The lower protective film 175 may be attached to the rear surface of the substrate 100. An adhesive layer may be located between the lower protective film 175 and the substrate 100. Alternatively, the lower protective film 175 may be directly formed on the rear surface of the substrate 100, and in this case, the adhesive layer is not located between the lower protective film 175 and the substrate 100.

The lower protective film 175 may support and protect the substrate 100. The lower protective film 175 may have/define an opening 175OP corresponding to the second display area DA2. The lower protective film 175 may include an organic insulating material, such as polyethylene terephthalate (PET) and/or polyimide (PI).

The display layer 200 may include a plurality of sub-pixels. Each sub-pixel may include a display element, and may emit red light, green light, or blue light. The display element may include a light-emitting diode LED. In one or more embodiments, the light-emitting diode LED may include an organic light-emitting diode including an organic emission layer. In one or more other embodiments, the light-emitting diode LED may be an inorganic light-emitting diode including an inorganic material. The inorganic light-emitting diode may include a PN junction diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers. In some embodiments, the light-emitting diode LED may include a quantum-dot light-emitting diode. An emission layer of the light-emitting diode LED may include an organic material, may include an inorganic material, may include quantum dots, may include an organic material and quantum dots, or may include an inorganic material and quantum dots.

The light-emitting diode LED may be electrically connected to a transistor TFT located under the light-emitting diode LED. In this regard, in FIG. 2, a buffer layer 111 is located on the substrate 100, the transistor TFT is located on the buffer layer 111, and the light-emitting diode LED and the transistor TFT are electrically connected to each other through a contact hole of an insulating layer IL covering the transistor TFT.

The transistor TFT, and the light-emitting diode LED electrically connected to the transistor TFT, may be located in each of the first display area DA1 and the second display area DA2. In this case, an area where the transistor TFT and the light-emitting diode LED are located may be referred to as a sub-pixel circuit area PCA. For convenience, the sub-pixel circuit area PCA located in the first display area DA1 is referred to as a first sub-pixel circuit area PCA1, and the sub-pixel circuit area PCA located in the second display area DA2 is referred to as a second sub-pixel circuit area PCA2. The first display area DA1 and the second display area DA2 may include a separation area IVA between adjacent sub-pixel circuit areas. For example, the first display area DA1 may include a second separation area IVA2 located between adjacent first sub-pixel circuit areas PCA1, and the second display area DA2 may include a first separation area IVA1 located between adjacent second sub-pixel circuit areas PCA2 and between second sub-pixel circuit areas PCA2 and first sub-pixel circuit areas PCA1 respectively adjacent thereto. The separation area IVA of the second display area DA2 may be referred to as the first separation area IVA1, and the separation area IVA of the first display area DA1 may be referred to as the second separation area IVA2. The first separation area IVA1 and the second separation area IVA2 are areas where the transistors TFT are not located. In some embodiments, light-emitting diodes may be omitted from the first and second separation areas IVA1 and IVA2. For example, each of the first separation area IVA1 and the second separation area IVA2 may correspond to a space between adjacent sub-pixel circuit areas and/or a space between adjacent light-emitting diodes (or emission areas). The first separation area IVA1 of the second display area DA2 may include a transmissive area TA.

The second display area DA2 may include the transmissive area TA. The transmissive area TA may correspond to at least a part of the first separation area IVA1. In other words, the first separation area IVA1 of the second display area DA2 may include the transmissive area TA. The transmissive area TA is an area where light emitted from the component 20 and/or light traveling toward the component 20 may be transmitted. In the display panel, a transmittance of the transmissive area TA may be about 20% or more, about 30% or more, about 40% or more, about 50% or more, about 60% or more, about 70% or more, about 75% or more, about 80% or more, about 85% or more, or about 90% or more. The display layer 200 may be sealed by an encapsulation member. In some embodiments, the encapsulation member may include the encapsulation layer 300. The encapsulation layer 300 may include at least one inorganic encapsulation layer and at least one organic encapsulation layer. In one or more embodiments, the encapsulation layer 300 may include first and second inorganic encapsulation layers 310 and 330, and an organic encapsulation layer 320 between the first and second inorganic encapsulation layers 310 and 330. In one or more embodiments, the encapsulation member may be an encapsulation substrate including glass.

The input sensing layer 400 may be formed on the encapsulation layer 300. The input sensing layer 400 may obtain coordinate information according to an external input, for example, a touch event of an object, such as a finger or a stylus pen. The input sensing layer 400 may include a touch electrode and trace lines connected to the touch electrode. The input sensing layer 400 may detect an external input by using a mutual capacitance method or a self-capacitance method.

The anti-reflection layer 600 may be formed on the encapsulation layer 300. The anti-reflection layer 600 may reduce a reflectance of light (external light) incident from the outside on the display panel. The anti-reflection layer 600 may include a filter plate including a light-blocking unit and color filters. The filter plate may include the color filters, the light-blocking unit, and an overcoat layer located for each sub-pixel.

The window 700 may be located on the anti-reflection layer 600, and may be coupled to the anti-reflection layer 600 through an adhesive layer, such as an optically clear adhesive (OCA). The window 700 may include a glass material or a plastic material. Examples of the plastic material may include polyethersulfone, polyacrylate, polyether imide, polyethylene naphthalate, polyethylene terephthalate, polyphenylene sulfide, polyarylate, polyimide, polycarbonate, and cellulose acetate propionate.

The component 20 may overlap the second display area DA2 of the display area DA. The component 20 may include a proximity sensor, an illuminance sensor, an iris sensor, a face recognition sensor, and a camera (or an image sensor). The component 20 may use light. For example, the component 20 may emit and/or receive light in infrared, ultraviolet, and/or visible bands. The proximity sensor using infrared rays may detect an object located adjacent to a top surface of the electronic device 1, and the illuminance sensor may detect a brightness of light incident on the top surface of the electronic device 1. Also, the iris sensor may capture an image of the iris of a person located on the top surface of the electronic device 1, and the camera may receive light about an object located on the top surface of the electronic device 1. The component 20 overlapping the second display area DA2 of the display panel 10 is not limited to the proximity sensor, the illuminance sensor, the iris sensor, the face recognition sensor, and the image sensor, and various sensors may be located.

FIGS. 3A through 3H are plan views schematically illustrating a display panel, according to embodiments.

Figure 3A:
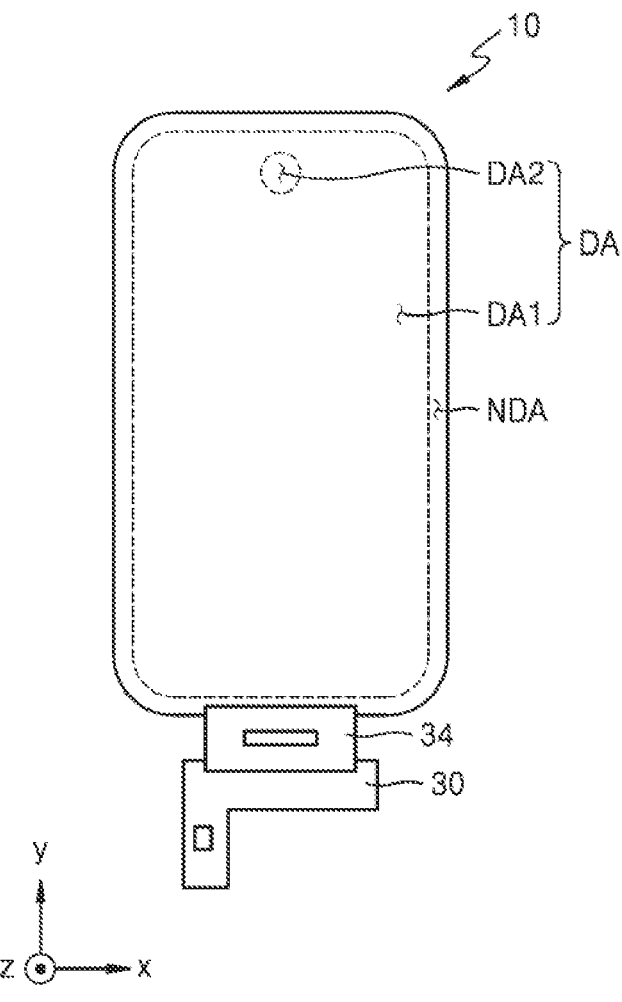
FIGS. 3A through 3H are plan views schematically illustrating a display panel, according to embodiments.

FIGS. 3A through 3H illustrate various arrangements of the first and second display areas DA1 and DA2. The display area DA may be entirely surrounded by the non-display area NDA (e.g., in plan view). A pad unit may be located in the non-display area NDA, and as shown in FIG. 3A, a display circuit board 30 may be electrically connected to the pad unit of the non-display area NDA through a flexible film 34 of the non-display area NDA. The display circuit board 30 may be a flexible printed circuit board (FPCB) that may be bent, a rigid printed circuit board (PCB) that is rigid and thus is not easily bent, or a hybrid printed circuit board including both a rigid printed circuit board and a flexible printed circuit board.

The display area DA may include the first display area DA1 and the second display area DA2. The second display area DA2 may be a component area where the component 20 is located as described above.

Referring to FIGS. 3A through 3E, the second display area DA2 may be located in the first display area DA1, and may be entirely surrounded by the first display area DA1 (e.g., in plan view). The second display area DA2 may have a circular shape in a plan view. Alternatively, the second display area DA2 may have an elliptical shape or a polygonal shape, such as a quadrangular shape.

Figure 3B:
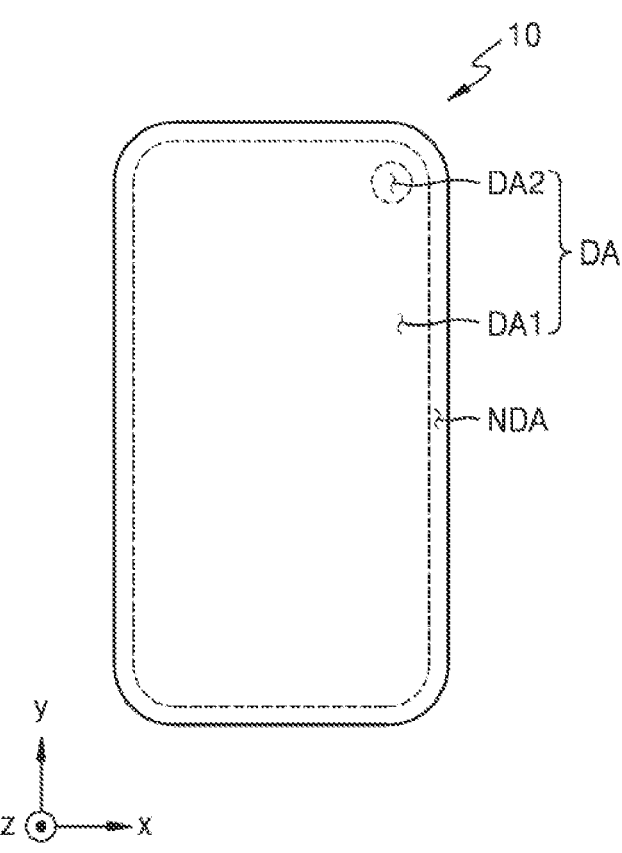
Figure 3C:
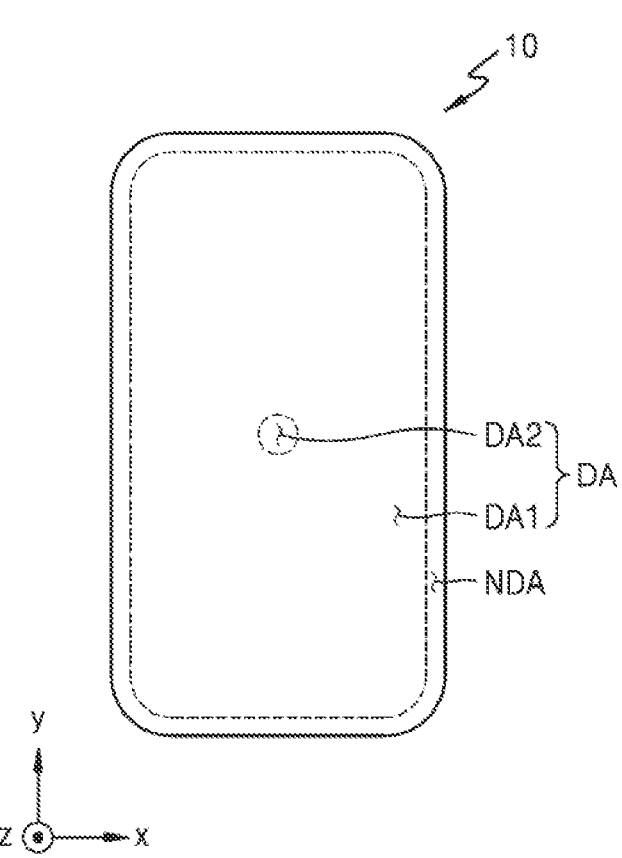

The second display area DA2 may be located at any of various positions. The second display area DA2 may be located in the center of an upper portion of the display area DA in a plan view, as shown in FIG. 3A. The second display area DA2 may be located in an upper right portion of the display area DA in a plan view, as shown in FIG. 3B. Alternatively, the second display area DA2 may be located in a central portion of the display area DA in a plan view as shown in FIG. 3C, and in this case, when the component located to correspond to the second display area DA2 includes a camera, the gaze of a user who takes a selfie or makes a video call may be natural (e.g., the gaze may be directed at the camera).

In the specification, "left," "right," "upper," and "lower" in a plan view refer to directions when the electronic device 1 is viewed in a direction perpendicular to the display panel 10. For example, "left" refers to a –x direction, "right" refers to a +x direction, "upper" refers to a +y direction, and "lower" refers to a –y direction. Although one second display area DA2 is located in FIG. 3A, in one or more other embodiments, a plurality of second display areas DA2 may be provided.

Figure 3D:
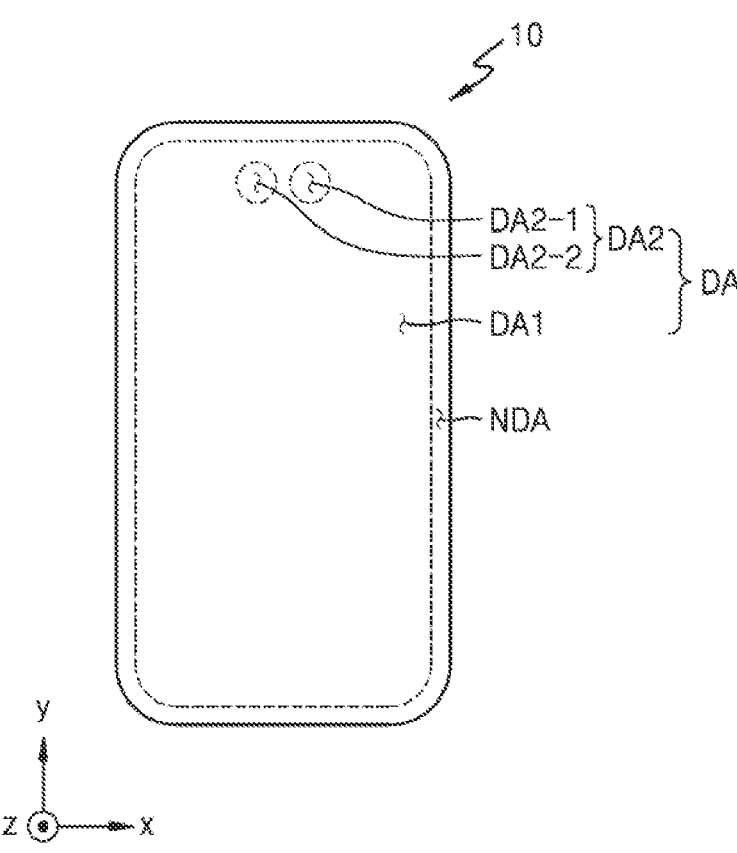
Figure 3E:
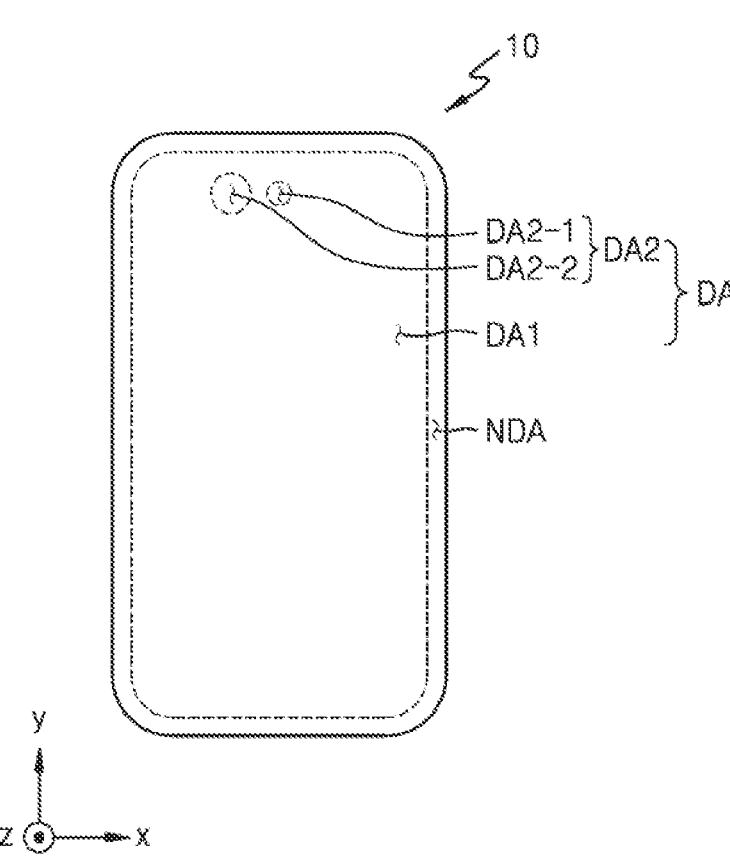

The second display area DA2 may include two or more sub-display areas located adjacent to each other as shown in FIGS. 3D and 3E, and in one or more embodiments, FIGS. 3D and 3E illustrate a first sub-display area DA2-1 and a second sub-display area DA2-2. The first sub-display area DA2-1 and the second sub-display area DA2-2 may be located adjacent to each other in the x direction as shown in FIGS. 3D and 3E, or may be located adjacent to each other in the y direction. The first sub-display area DA2-1 and the second sub-display area DA2-2 may have the same size as shown in FIG. 3D, or may have different sizes as shown in FIG. 3E.

Figure 3F:
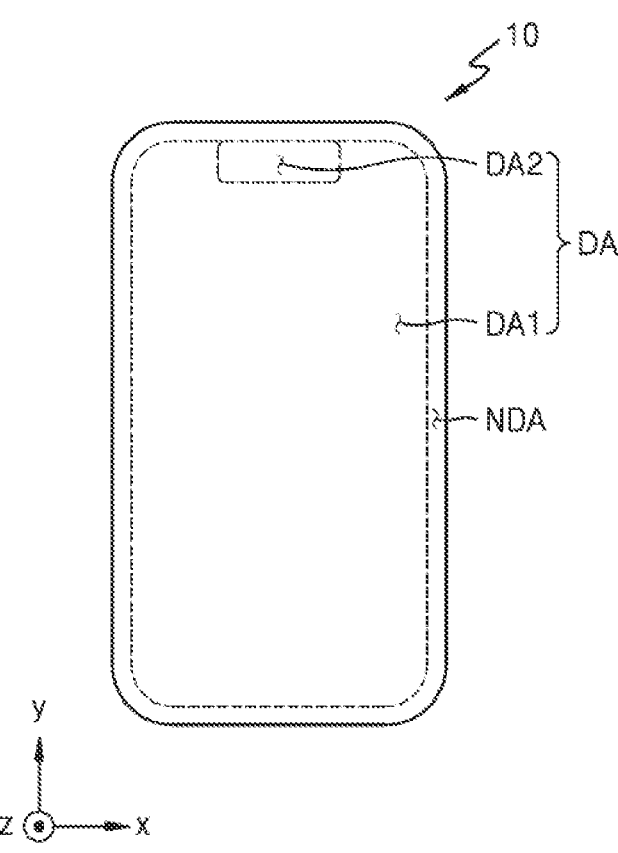
Figure 3G:
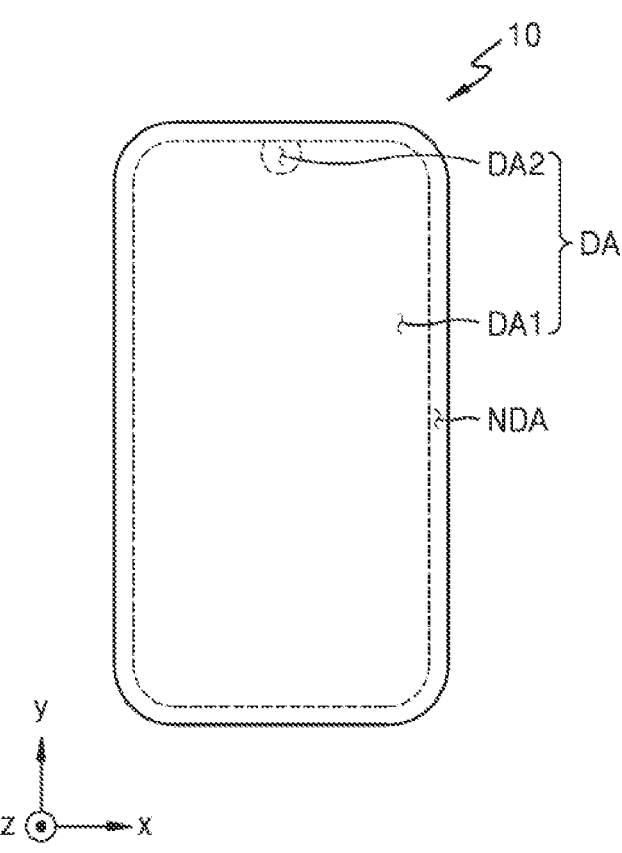
Figure 3H:
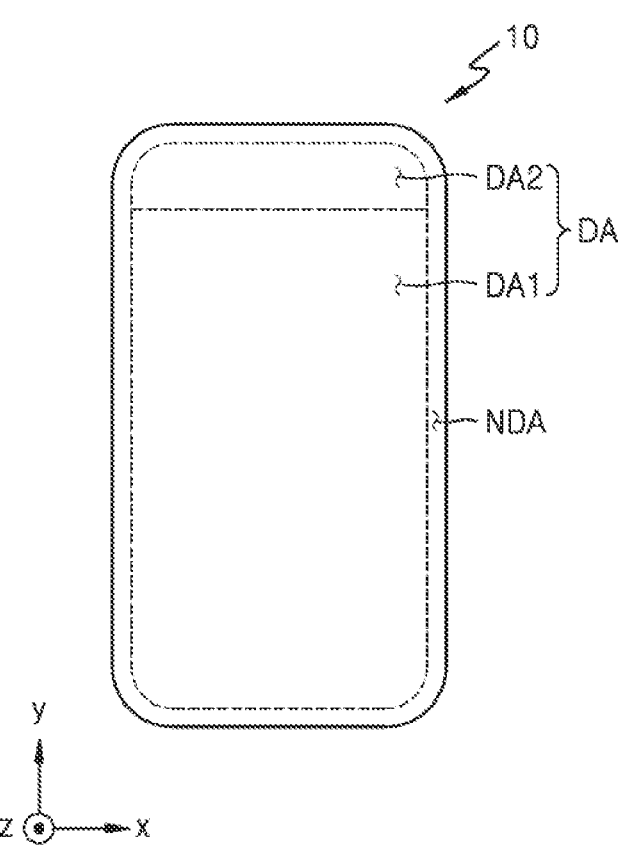

The second display area DA2 may be located on a side of the first display area DA1 as shown in FIGS. 3F through FIG. 3H, and may be partially surrounded by the first display area DA1 so that a side of the second display area DA2 is adjacent to the non-display area NDA.

The second display area DA2 may be a notch-type area that is concave toward the center of the display area DA from a side of the display area DA as shown in FIGS. 3F and 3G. The notch-type area may have any of various shapes, such as a quadrangular shape, a semicircular shape, or a semielliptical shape. The second display area DA2 may be a bar-type area extending in the x direction as shown in FIG. 3H.

Figure 4:
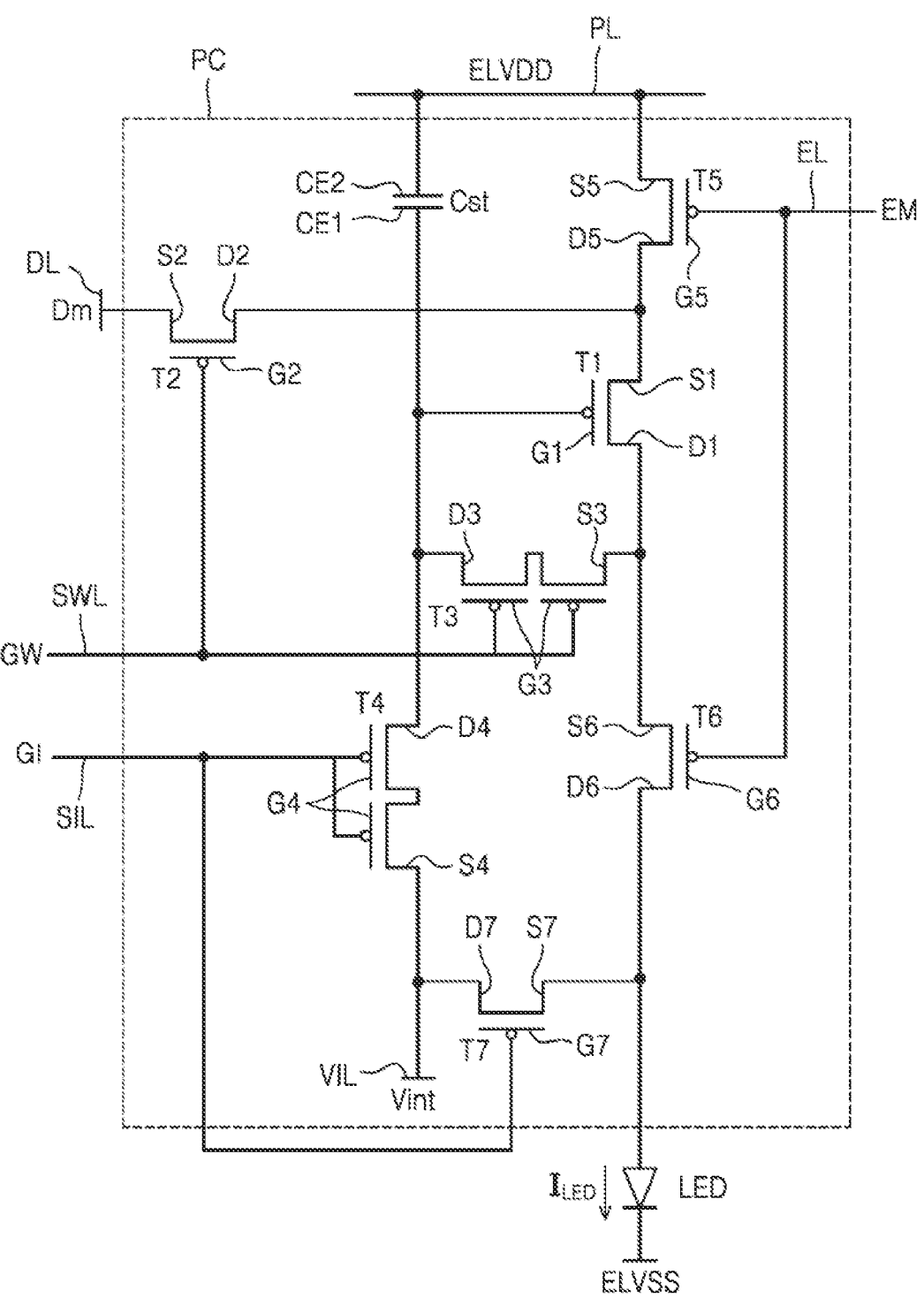
FIG. 4 is a circuit diagram illustrating a light-emitting diode corresponding to any one sub-pixel of a display panel and a sub-pixel circuit electrically connected to the light-emitting diode, according to one or more embodiments.

FIG. 4 is a circuit diagram illustrating a light-emitting diode corresponding to any one sub-pixel of a display panel and a sub-pixel circuit electrically connected to the light-emitting diode, according to one or more embodiments.

Referring to FIG. 4, a sub-pixel circuit PC is electrically connected to a light-emitting diode LED. The sub-pixel circuit PC may include a plurality of transistors and a storage capacitor, and the transistors and the storage capacitor may be electrically connected to conductive lines. The conductive lines may include signal lines (e.g., SWL, SIL, EL, and DL), an initialization voltage line VIL, and a driving voltage line PL.

Although each sub-pixel circuit PC is connected to the signal lines (e.g., SWL, SIL, EL, and DL), the initialization voltage line VIL, and the driving voltage line PL in FIG. 4, the disclosure is not limited thereto. In one or more other embodiments, at least one of the signal lines (e.g., SWL, SIL, EL, and/or DL), the initialization voltage line VIL, and the driving voltage line PL may be shared by neighboring sub-pixel circuits PC.

In one or more embodiments, in FIG. 4, the sub-pixel circuit PC includes a driving transistor T1, a switching transistor T2, a compensation transistor T3, a first initialization transistor T4, an operation control transistor T5, an emission control transistor T6, and a second initialization transistor T7.

The signal lines include a first scan line SWL that transmits a scan signal GW, a second scan line SIL that transmits a previous scan signal GI to the first initialization transistor T4 and to the second initialization transistor T7, an emission control line EL that transmits an emission control signal EM to the operation control transistor T5 and to the emission control transistor T6, and a data line DL that crosses the first scan line SWL and that transmits a data signal Dm. The driving voltage line PL may transmit a driving voltage ELVDD to the driving transistor T1, and the initialization voltage line VIL may transmit an initialization voltage Vint for initializing a first electrode (e.g., anode) of the light-emitting diode and the driving transistor T1.

A storage capacitor Cst includes a first electrode CE1 connected to a gate electrode of the driving transistor T1, and a second electrode CE2 connected to the driving voltage line PL. A second electrode of the light-emitting diode LED is connected to a common voltage ELVSS. Accordingly, the light-emitting diode LED may receive driving current $I_{LED}$ from the driving transistor T1 to emit light.

Although each of the compensation transistor T3 and the first initialization transistor T4 includes a dual gate electrode in FIG. 4, either or both of the compensation transistor T3 and the first initialization transistor T4 may include one gate electrode, respectively, in one or more other embodiments.

Although the sub-pixel circuit PC includes seven transistors and one storage capacitor in FIG. 4, the disclosure is not limited thereto. The number of transistors and storage capacitors may be changed in various ways, for example, to 6 or fewer transistors, or to 8 or more transistors, according to a design of the sub-pixel circuit PC.

Although the first initialization transistor T4 and the second initialization transistor T7 are connected to the second scan line SIL in FIG. 4, the disclosure is not limited thereto. In one or more other embodiments, the first initialization transistor T4 may be connected to the second scan line SIL and may operate according to the previous scan signal GI, and the second initialization transistor T7 may be connected to a first scan line or to a second scan line of a sub-pixel circuit PC located in a row before, or in a row after, the sub-pixel circuit PC.

Figure 5:
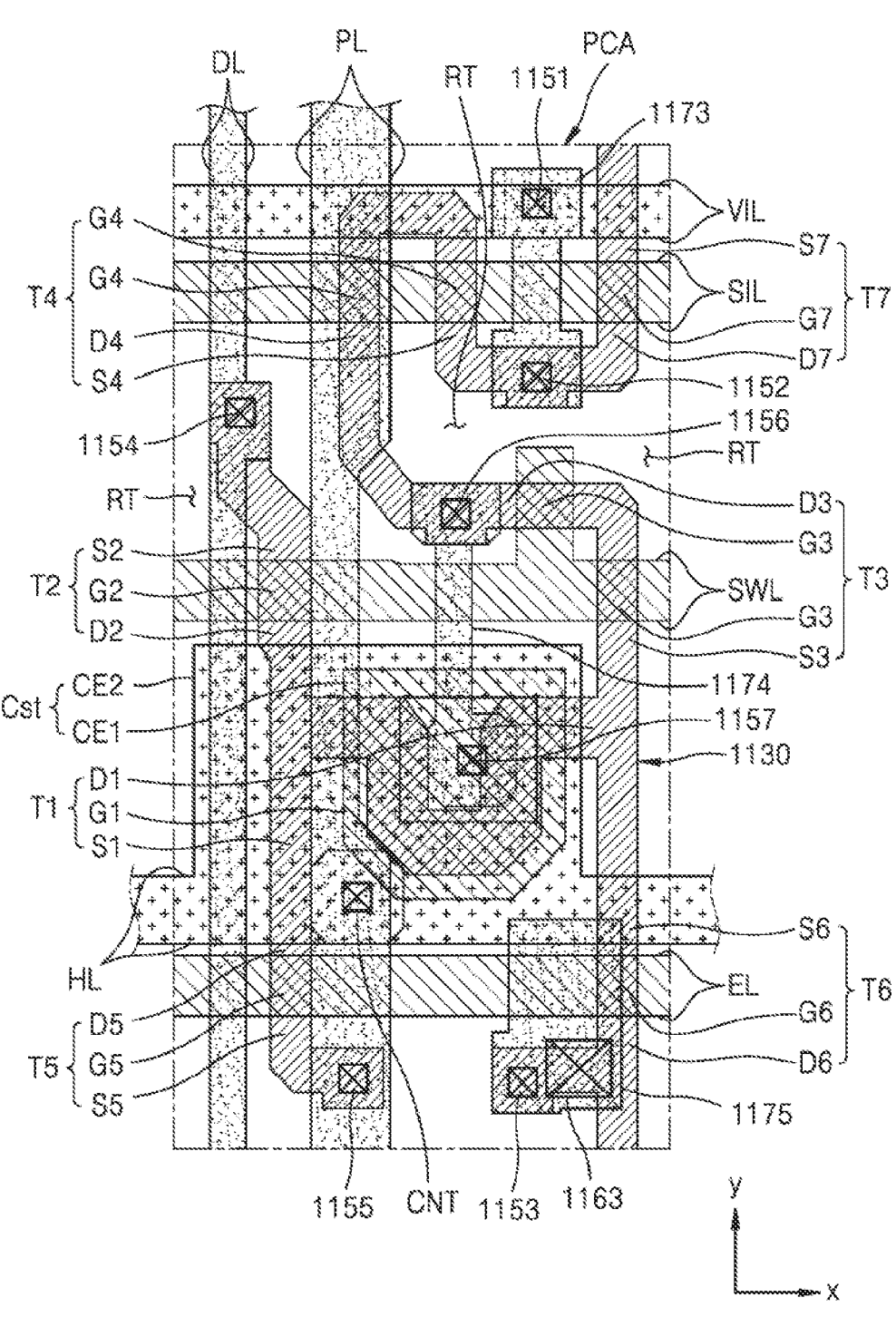
FIG. 5 is a plan view illustrating any one sub-pixel circuit of a display panel, according to one or more embodiments.

FIG. 5 is a plan view illustrating any one sub-pixel circuit of a display panel, according to one or more embodiments. A sub-pixel circuit of FIG. 5 is located in each of a first display area and a second display area of a display panel, and an area (or an area occupied by each sub-pixel circuit) in which each sub-pixel circuit is located is referred to as the sub-pixel circuit area PCA.

In one or more embodiments, each sub-pixel circuit may include the driving transistor T1, the switching transistor T2, the compensation transistor T3, the first initialization transistor T4, the operation control transistor T5, the emission control transistor T6, and the second initialization transistor T7 as shown in FIG. 5.

The driving transistor T1, the switching transistor T2, the compensation transistor T3, the first initialization transistor T4, the operation control transistor T5, the emission control transistor T6, and the second initialization transistor T7 may be located along a semiconductor layer 1130 in the sub-pixel circuit area PCA.

Some portions of the semiconductor layer 1130 correspond to semiconductor layers of the driving transistor T1, the switching transistor T2, the compensation transistor T3, the first initialization transistor T4, the operation control transistor T5, the emission control transistor T6, and the second initialization transistor T7. In other words, the semiconductor layers of the driving transistor T1, the switching transistor T2, the compensation transistor T3, the first initialization transistor T4, the operation control transistor T5, the emission control transistor T6, and the second initialization transistor T7 may be connected to one another, and may be bent in various shapes.

Although the driving transistor T1, the switching transistor T2, the compensation transistor T3, the first initialization transistor T4, the operation control transistor T5, the emission control transistor T6, and the second initialization transistor T7 are formed along the semiconductor layer 1130 in FIG. 5, the disclosure is not limited thereto. In one or more other embodiments, some transistors may be formed along the semiconductor layer 1130, whereas the remaining transistors may be formed along another semiconductor layer spatially and electrically separated from the semiconductor layer 1130. For example, the compensation transistor T3 and/or the first initialization transistor T4 may be formed along a semiconductor layer including a material that is different from that of the semiconductor layer 1130 of FIG. 5. In some embodiments, when the semiconductor layer 1130 includes a silicon-based semiconductor material, the semiconductor layer along which the compensation transistor T3 and/or the first initialization transistor T4 is formed may include an oxide-based semiconductor material.

The semiconductor layer 1130 may include a channel region, and a source region and a drain region on respective sides of the channel region. The source region and the drain region may respectively be a source electrode and a drain electrode of a corresponding transistor. For convenience of explanation, a source region and a drain region are respectively referred to as a source electrode and a drain electrode.

The driving transistor T1 includes a driving gate electrode G1 overlapping a driving channel region, and a driving source electrode S1 and a driving drain electrode D1 on respective sides of the driving channel region. The driving channel region overlapping the driving gate electrode G1 may have a bent shape, such as an omega shape, to form a long channel in a narrow space. When the driving channel region is long, a driving range of a gate voltage may be increased, a grayscale of light emitted by an organic light-emitting diode OLED may be more precisely controlled, and thus, display quality may be improved.

The switching transistor T2 includes a switching gate electrode G2 overlapping a switching channel region, and a switching source electrode S2 and a switching drain electrode D2 on both sides of the switching channel region. The switching drain electrode D2 may be connected to the driving source electrode S1.

The compensation transistor T3 that is a dual transistor may include compensation gate electrodes G3 overlapping two compensation channel regions, and a compensation source electrode S3 and a compensation drain electrode D3 on respective sides of the compensation channel regions. The compensation transistor T3 may be connected to the driving gate electrode G1 of the driving transistor T1 through a node connection line 1174 described below.

The first initialization transistor T4 that is a dual transistor may include first initialization gate electrodes G4 overlapping two first initialization channel regions, and a first initialization source electrode S4 and a first initialization drain electrode D4 on respective sides of the first initialization channel regions.

The operation control transistor T5 may include an operation control gate electrode G5 overlapping an operation control channel region, and an operation control source electrode S5 and an operation control drain electrode D5 on respective sides of the operation control channel region. The operation control drain electrode D5 may be connected to the driving source electrode S1.

The emission control transistor T6 may include an emission control gate electrode G6 overlapping an emission control channel region, and an emission control source electrode S6 and an emission control drain electrode D6 on respective sides of the emission control channel region. The emission control source electrode S6 may be connected to the driving drain electrode D1.

The second initialization transistor T7 may include a second initialization gate electrode G7 overlapping a second initialization channel region, and a second initialization source electrode S7 and a second initialization drain electrode D7 on respective sides of the second initialization channel region.

The first scan line SWL, the second scan line SIL, the emission control line EL, and the driving gate electrode G1 may be located on the semiconductor layer 1130 with an insulating layer(s) therebetween.

Each of the first scan line SWL, the second scan line SIL, and the emission control line EL may extend in a first direction (x direction). Some portions of the first scan line SWL may correspond to the switching gate electrode G2 and to the compensation gate electrode G3. Some portions of the second scan line SIL may correspond to the first initialization gate electrode G4 and to the second initialization gate electrode G7. Some portions of the emission control line EL may correspond to the operation control gate electrode G5 and to the emission control gate electrode G6.

The driving gate electrode G1 that is an isolated electrode may be connected to the compensation transistor T3 through the node connection line 1174. An electrode voltage line HL may be located on the first scan line SWL, the second scan line SIL, the emission control line EL, and the driving gate electrode G1 with an insulating layer(s) therebetween.

The electrode voltage line HL may extend in the first direction to cross the data line DL and the driving voltage line PL. A part of the electrode voltage line HL may cover at least a part of the driving gate electrode G1, and may constitute the storage capacitor Cst along with the driving gate electrode G1. For example, the driving gate electrode G1 may serve as the first electrode CE1 of the storage capacitor Cst, and a part of the electrode voltage line HL may serve as the second electrode CE2 of the storage capacitor Cst.

The second electrode CE2 of the storage capacitor Cst is electrically connected to the driving voltage line PL described below. In this regard, the electrode voltage line HL may be connected to the driving voltage line PL located on the electrode voltage line HL through a contact hole CNT. Accordingly, the electrode voltage line HL and the driving voltage line PL may have the same voltage level (e.g., a constant voltage). The electrode voltage line HL may be a transverse driving voltage line.

The data line DL, the driving voltage line PL, an initialization connection line 1173, and the node connection line 1174 may be located on the electrode voltage line HL with an insulating layer(s) therebetween.

The data line DL and the driving voltage line PL may extend in a second direction (y direction). The data line DL may be connected to the switching source electrode S2 of the switching transistor T2 through a contact hole 1154. A part of the data line DL may be a switching source electrode.

An end of the initialization connection line 1173 may be connected to the first and second initialization transistors T4 and T7 through a contact hole 1152, and the other end of the initialization connection line 1173 may be connected to the initialization voltage line VIL through a contact hole 1151.

An end of the node connection line 1174 may be connected to the compensation drain electrode D3 through a contact hole 1156, and the other end of the node connection line 1174 may be connected to the driving gate electrode G1 through a contact hole 1157.

The initialization voltage line VIL may be located on the data line DL, the driving voltage line PL, the initialization connection line 1173, and the node connection line 1174 with an insulating layer(s) therebetween.

The initialization voltage line VIL may extend in the first direction (x direction). The initialization voltage line VIL may be connected to the first and second initialization driving transistors T4 and T7 through the initialization connection line 1173. The initialization voltage line VIL and the electrode voltage line HL may be located on the same layer, and may include the same material.

Although the driving transistor T1, the switching transistor T2, the compensation transistor T3, the first initialization transistor T4, the operation control transistor T5, the emission control transistor T6, and the second initialization transistor T7 are P-type MOSFETs in FIGS. 4 and 5, the disclosure is not limited thereto. In one or more other embodiments, some transistors may be N-type MOSFETs. For example, the first initialization transistor T4 and the second initialization transistor T7 may be N-type MOSFETs, and in this case, semiconductors of the first initialization transistor T4 and the second initialization transistor T7 may include different materials than, and may be located on different layers than, semiconductors of the other transistors.

Figure 6:
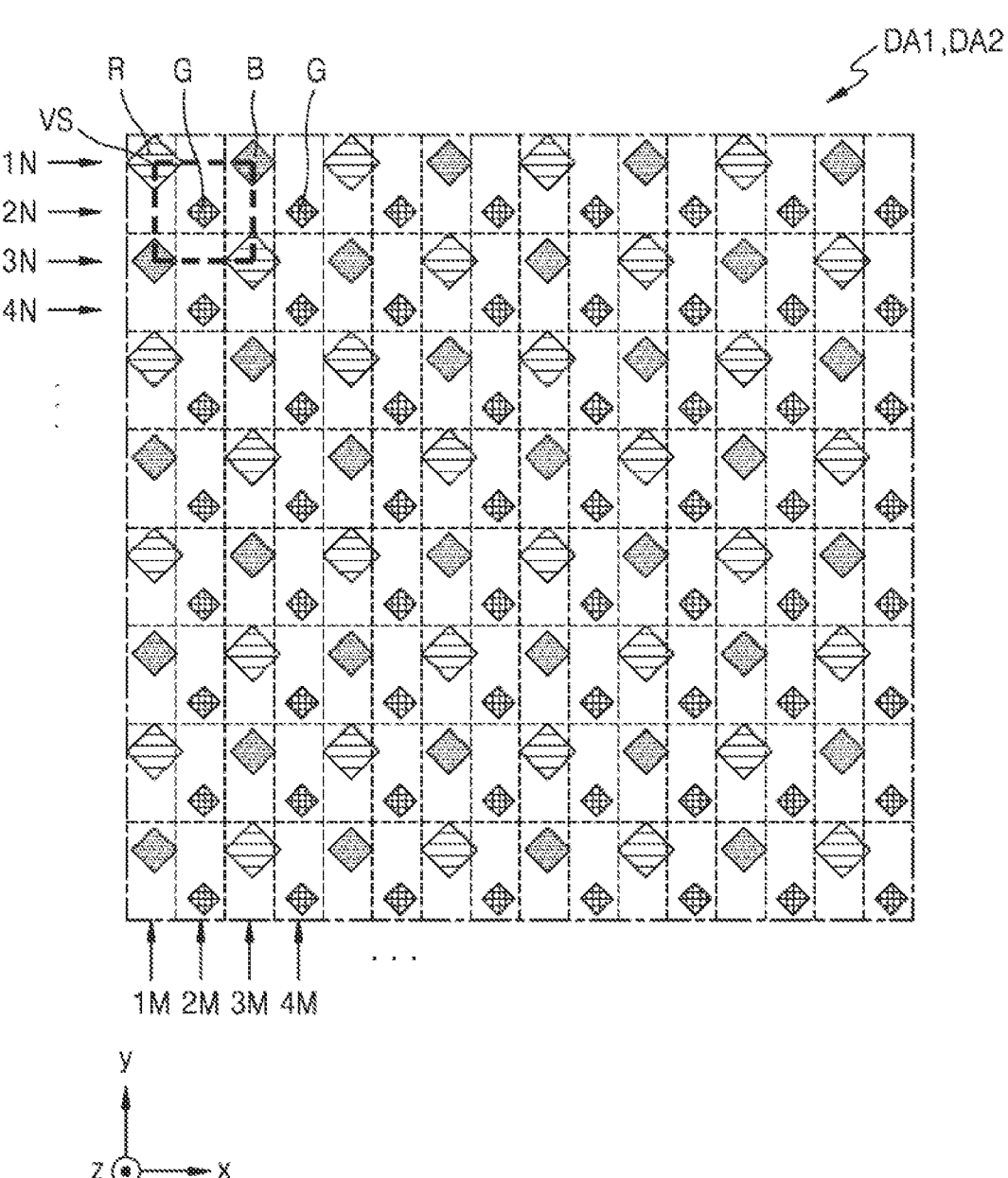
FIG. 6 is a plan view illustrating sub-pixels located in a first display area and a second display area of a display panel, according to one or more embodiments.

FIG. 6 is a plan view illustrating sub-pixels located in a first display area and a second display area of a display panel, according to one or more embodiments.

Referring to FIG. 6, a red sub-pixel R, a green sub-pixel G, and a blue sub-pixel B may be located in the first and second display areas DA1 and DA2. The red sub-pixel R, the green sub-pixel G, and the blue sub-pixel B may emit light of different colors through light-emitting diodes.

The arrangement, aperture ratio (ratio of an emission area per unit area), and/or number of the red sub-pixels R, the green sub-pixels G, and the blue sub-pixels B of the first display area DA1 may respectively be the same as the arrangement, aperture ratio, and/or number of the red sub-pixels R, the green sub-pixels G, and the blue sub-pixels B of the second display area DA2. For example, the arrangement and/or number of sub-pixels of the first display area DA1 per unit area may be the same as the arrangement and/or number of sub-pixels of the second display area DA2 per unit area. Because sub-pixels, for example, the red sub-pixels R, the green sub-pixels G, and the blue sub-pixels B, respectively include light-emitting diodes, when the arrangement and/or number of sub-pixels is the same, it may mean that the arrangement and/or number of light-emitting diodes is the same. For example, per unit area, the arrangement and/or number of light-emitting diodes located in the first display area DA1 may be the same as the arrangement and/or number of light-emitting diodes located in the second display area DA2.

The red sub-pixel R, the green sub-pixel G, and the blue sub-pixel B may be arranged in a PENTILE™ type (e.g., a RGBG matrix structure, a PENTILE™ matrix structure, a PENTILE™ structure, or an RGBG structure, PENTILE™ being a registered trademark of Samsung Display Co., Ltd., Republic of Korea). A plurality of red sub-pixels R and a plurality of blue sub-pixels B are alternately arranged in a first row 1N, a plurality of green sub-pixels G are arranged to be spaced apart from each other by a certain interval in a second row 2N adjacent to the first row 1N, a plurality of blue sub-pixels B and a plurality of red sub-pixels R are alternately arranged in a third row 3N adjacent to the second row 2N, and a plurality of green sub-pixels G are arranged to be spaced apart from each other by a certain interval in a fourth row 4N adjacent to the third row 3N, and this sub-pixel arrangement is repeated up to an $N^{th}$ row. In this case, the size (or width) of the blue sub-pixel B and the red sub-pixel R may be greater than the size (or width) of the green sub-pixel G.

The plurality of red sub-pixels R and the blue sub-pixels B located in the first row 1N, and the plurality of green sub-pixels G located in the second row 2N, may be alternately arranged. Accordingly, a plurality of red sub-pixels R and a plurality of blue sub-pixels B are alternately arranged in a first column 1M, a plurality of green sub-pixels G are arranged to be spaced apart from each other by a certain interval in a second column 2M adjacent to the first column 1M, a plurality of blue sub-pixels B and a plurality of red sub-pixels R are alternately arranged in a third column 3M adjacent to the second column 2M, and a plurality of green sub-pixels G are arranged to be spaced apart from each other by a certain interval in a fourth column 4M adjacent to the third column 3M, and this sub-pixel arrangement is repeated up to an $M^{th}$ column.

When such a sub-pixel arrangement structure is differently expressed, from among vertices of a virtual quadrangular shape VS having a center point of a second sub-pixel Pb as a center point of the virtual quadrangular shape VS, first sub-pixels Pa may be located at first and third vertices that face each other (e.g., diagonally), and third sub-pixels Pc may be located at second and fourth vertices that are the remaining vertices. In this case, the virtual quadrangular shape VS may be modified to any of various shapes, such as a rectangular shape, a diamond shape, or a square shape.

Such a sub-pixel arrangement structure may be referred to as a PENTILE™ matrix structure or a PENTILE™ structure, and a rendering driving method that represents a color by sharing adjacent sub-pixels, may be used, thereby displaying an image having a high resolution with a small number of pixels.

Although first sub-pixels P1 located in the first display area DA1 are arranged in a PENTILE™ matrix structure in FIG. 6, the disclosure is not limited thereto. For example, the first sub-pixels P1, for example, the first sub-pixel Pa, the second sub-pixel Pb, and the third sub-pixel Pc, may be arranged in any of various structures, such as a stripe structure, a mosaic arrangement structure, or a delta arrangement structure.

As shown in FIG. 6, the first display area DA1 and the second display area DA2 may have the same sub-pixel arrangement. A sub-pixel density of the first display area DA1 and a sub-pixel density of the second display area DA2 may be the same. In other words, per unit area, the number (or area) of sub-pixels of the first display area DA1 may be the same as the number (or area) of sub-pixels of the second display area DA2.

Figure 7:
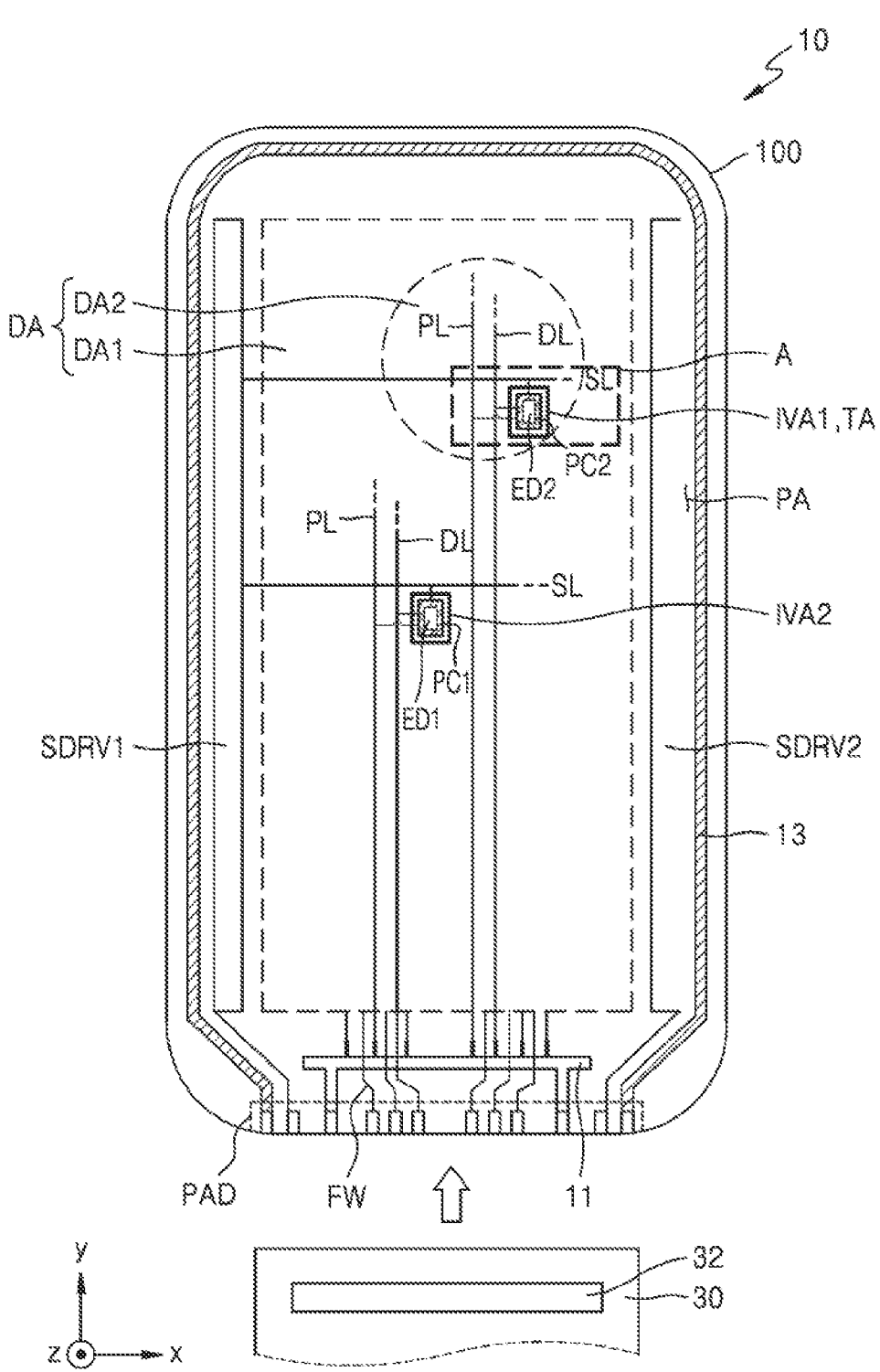
FIG. 7 is a plan view schematically illustrating a display panel, according to one or more embodiments.

FIG. 7 is a plan view schematically illustrating a display panel, according to one or more embodiments. Referring to FIG. 7, the display panel 10 may include the display area DA and a peripheral area PA. The display area DA may include the first and second display areas DA1 and DA2. The first display area DA1 and the second display area DA2 may display an image by using light-emitting diodes that are two-dimensionally arranged.

Light-emitting diodes are located in the first and second display areas DA1 and DA2, and sub-pixel circuits respectively electrically connected to the light-emitting diodes are located in the first display area DA1 and the second display area DA2. For example, first sub-pixel circuits PC1 electrically connected to first light-emitting diodes ED1 located in the first display area DA1 may be located in the first display area DA1, and second sub-pixel circuits PC2 electrically connected to second light-emitting diodes ED2 located in the second display area DA2 may be located in the second display area DA2.

The first sub-pixel circuit PC1 is electrically connected to the scan line SL extending in the first direction (e.g., x direction) and the data line DL extending in the second direction (e.g., y direction). The second sub-pixel circuit PC2 is electrically connected to the scan line SL extending in the first direction (e.g., X direction) and the data line DL extending in the second direction (e.g., y direction).

The first sub-pixel circuit PC1 may be located in the sub-pixel circuit area PCA of the first display area DA1 described with reference to FIG. 5. In one or more embodiments, the first light-emitting diode ED1 electrically connected to the first sub-pixel circuit PC1 may be located in the sub-pixel circuit area PCA of the first display area DA1. The second sub-pixel circuit PC2 may be located in the sub-pixel circuit area PCA of the second display area DA2. The second light-emitting diode ED2 electrically connected to the second sub-pixel circuit PC2 may be located in the sub-pixel circuit area PCA of the second display area DA2. Adjacent sub-pixel circuit areas PCA may be spaced apart from each other, and the first and second separation areas IVA1 and IVA2 may be located between the adjacent sub-pixel circuit areas PCA. For example, the second display area DA2 may include the first separation area IVA1 at least partially surrounding the sub-pixel circuit area PCA in which the second light-emitting diode ED2 and the second sub-pixel circuit PC2 are located, and the first display area DA1 may include the second separation area IVA2 at least partially surrounding the sub-pixel circuit area in which the first light-emitting diode ED1 and the first sub-pixel circuit PC1 are located.

Also, the first separation area IVA1 of the second display area DA2 may include the transmissive area TA. The transmissive area TA may be located between the second light-emitting diodes ED2 and the second sub-pixel circuits PC2 adjacent to each other. In one or more embodiments, a portion of the second display area DA2 where the second light-emitting diodes ED2 and the second sub-pixel circuits PC2 are not located may correspond to the transmissive area TA.

In the peripheral area PA, a first driving circuit SDRV1 and a second driving circuit SDRV2 for applying signals to the first sub-pixel circuit PC1 and the second sub-pixel circuit PC2 may be located.

The first driving circuit SDRV1 may apply a scan signal to each of the first sub-pixel circuits PC1 and the second sub-pixel circuits PC2 through the scan line SL. The second driving circuit SDRV2 may be located opposite to the first driving circuit SDRV1 with the first display area DA1 therebetween. Some of the first sub-pixel circuits PC1 of the first display area DA1 and the second sub-pixel circuits PC2 of the second display area DA2 may be electrically connected to the first driving circuit SDRV1, and the rest may be electrically connected to the second driving circuit SDRV2.

A pad PAD may be located on a side of the substrate 100. The pad PAD may be exposed without being covered by an insulating layer, and may be connected to the display circuit board 30. The control driver 32 may be located on the display circuit board 30.

A control driver 32 may generate a control signal transmitted to the first driving circuit SDRV1 and the second driving circuit SDRV2. The control driver 32 may include a data driving circuit, and the data driving circuit may generate a data signal. The generated data signal may be transmitted to the first sub-pixel circuits PC1 and to the second sub-pixel circuit PC2 through a fan-out wiring FW located in the peripheral area PA of the display panel 10 and through the data line DL connected to the fan-out wiring FW. In one or more other embodiments, the data driving circuit may be located in the peripheral area PA of the substrate 100.

A driving voltage supply line 11 and a common voltage supply line 13 may be located in the peripheral area PA. The driving voltage supply line 11 may apply a driving voltage to each of sub-pixel circuits, for example, the first and second sub-pixel circuits PC1 and PC2, and the common voltage supply line 13 may apply a common voltage to second electrodes (cathodes) of light-emitting diodes, for example, the first and second light-emitting diodes ED1 and ED2.

The driving voltage supply line 11 may be located between the pad PAD and a side of the display area DA, and the common voltage supply line 13 may have a loop shape with one side open, and may partially surround the display area DA in a plan view. The driving voltage supply line 11 may be electrically connected to the driving voltage line PL passing through the display area DA.

The first and second light-emitting diodes ED1 and ED2, the first and second sub-pixel circuits PC1 and PC2, the pad PAD, the first and second driving circuits SDRV1 and SDRV2, the driving voltage supply line 11, and the common voltage supply line 13 are located on the substrate 100. A shape of the display panel 10 of FIG. 7 may be substantially the same as a shape of the substrate 100. Accordingly, when the display panel 10 includes the display area DA and the peripheral area PA, it may mean that the substrate 100 includes the display area DA and the peripheral area PA.

Figure 8A:
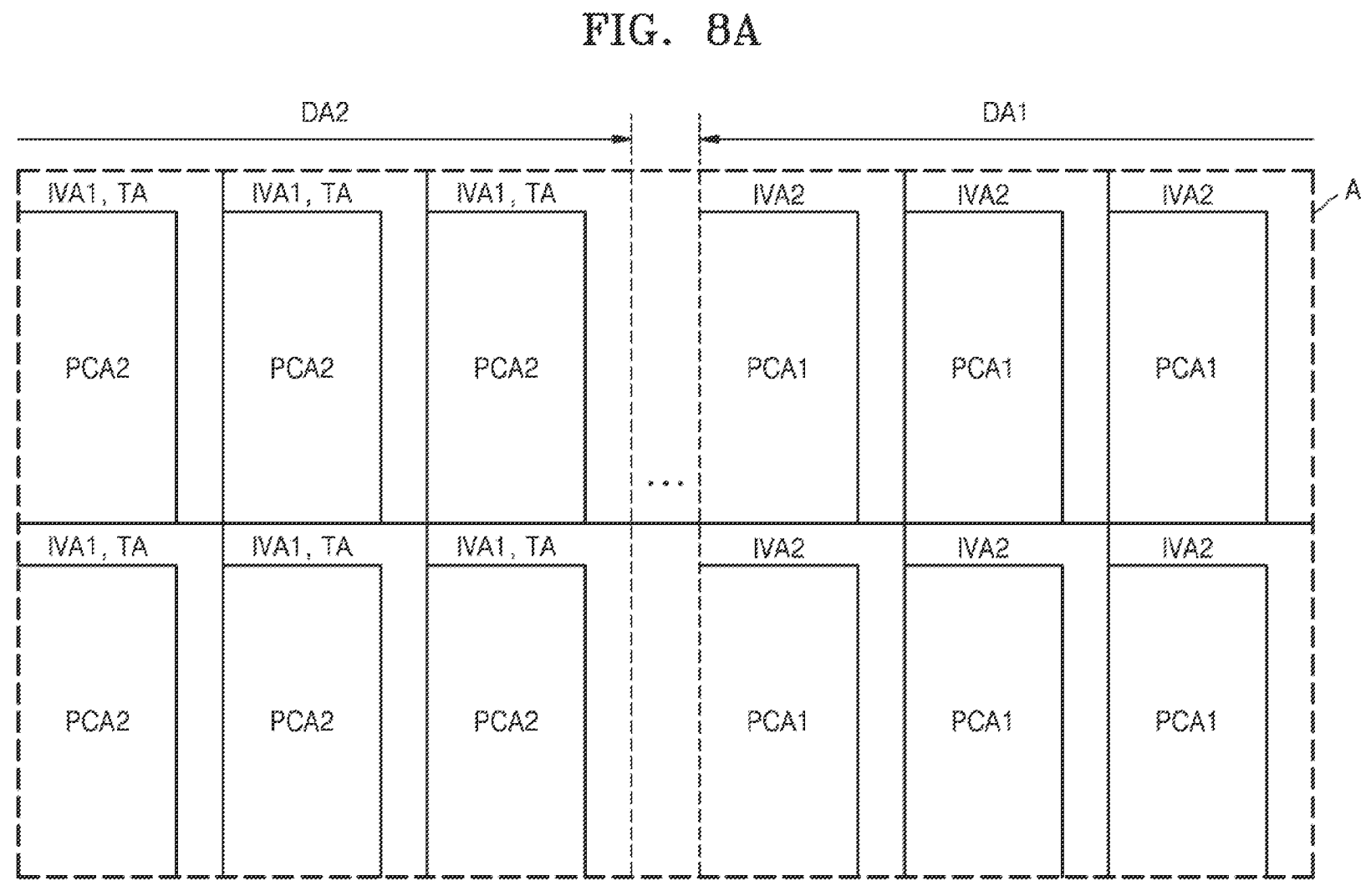
Figure 8B:
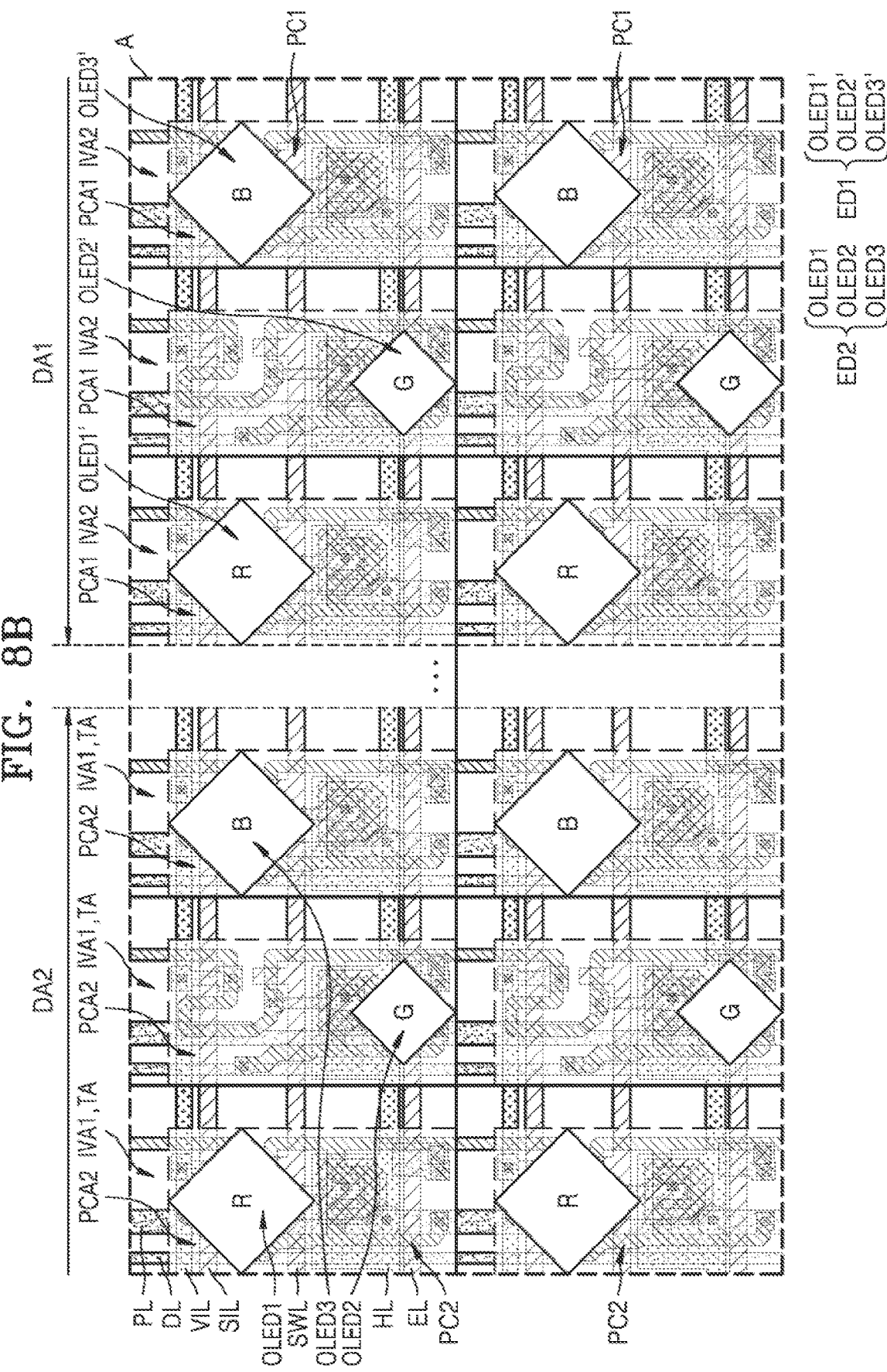

FIGS. 8A and 8B are enlarged plan views illustrating a portion A of FIG. 7. For convenience of explanation, FIG. 8A illustrates sub-pixel circuit areas and separation areas, and FIG. 8B illustrates elements located in the sub-pixel circuit areas and the separation areas of FIG. 8A.

Referring to FIG. 8A, the second display area DA2 may include a plurality of second sub-pixel circuit areas PCA2 and a plurality of first separation areas IVA1, and the first display area DA1 may include a plurality of first sub-pixel circuit areas PCA1 and a plurality of second separation areas IVA2.

Referring to FIGS. 8A and 8B, the first sub-pixel circuit area PCA1 is an area where the first sub-pixel circuit PC1 is located, and the second sub-pixel circuit area PCA2 is an area where the second sub-pixel circuit PC2 is located. Structures of the first sub-pixel circuit PC1 and the second sub-pixel circuit PC2 respectively located in the first sub-pixel circuit area PCA1 and the second sub-pixel circuit area PCA2 are the same as those described with reference to FIG. 5. In other words, the first sub-pixel circuit PC1 of the first sub-pixel circuit area PCA1, and the second sub-pixel circuit PC2 of the second sub-pixel circuit area PCA2, are the same as the sub-pixel circuit PC of the sub-pixel circuit area PCA described with reference to FIG. 5.

The second separation area IVA2 at least partially surrounding the first sub-pixel circuit area PCA1 is an area where electronic elements, such as a transistor, a capacitor, and/or a diode are not located, unlike the first sub-pixel circuit area PCA1. The first separation area IVA1 at least partially surrounding the second sub-pixel circuit area PCA2 is an area where electronic elements, such as a transistor, a capacitor, and/or a diode are not located, unlike the second sub-pixel circuit area PCA2. In one or more embodiments, in FIG. 8A, the first separation areas IVA1 and the second separation areas IVA2 are substantially L-shaped in a plan view.

As shown in FIG. 8A, the first sub-pixel circuit area PCA1 may be arranged to form rows and columns in the first display area DA1, and the second separation area IVA2 may be located between adjacent first sub-pixel circuit areas PCA1. The second sub-pixel circuit area PCA2 may be arranged to form rows and columns in the second display area DA2, and the first separation area IVA1 may be located between adjacent second sub-pixel circuit areas PCA2. In other words, as shown in FIG. 8B, the first sub-pixel circuits PC1 may be arranged to form rows and columns in the first display area DA1, and the second separation area IVA2 may be located between adjacent first sub-pixel circuits PC1. The second sub-pixel circuits PC2 may be arranged to form rows and columns in the second display area DA2, and the first separation area IVA1 may be located between adjacent second sub-pixel circuits PC2.

In a plan view, shapes of a plurality of first separation areas IVA1 located in the second display area DA2 may be substantially the same as shapes of a plurality of second separation areas IVA2 located in the first display area DA1. Per unit area, a proportion of the second display area DA2 occupied by the plurality of first separation areas IVA1 may be the same as a proportion of the first display area DA1 occupied by the plurality of second separation areas IVA2. That is, in the first display area DA1 and the second display area DA2, a plurality of sub-pixel circuit areas and a plurality of separation areas may be located in the same manner, although there is a difference in that the component 20 (see FIG. 2) may be located in the second display area DA2.

In the display panel having the above structure according to one or more embodiments, luminances of the first display area DA1 and the second display area DA2 may be uniform. In the related art, because a transmissive area through which light may be transmitted should be secured in a second display area in which a component, such as a camera, may be located, a sub-pixel circuit to which a light-emitting diode located in the second display area is connected may be located in an area other than the second display area. In contrast, in the display panel according to one or more embodiments, because the first and second sub-pixel circuits PC1 and PC2 electrically connected to the first and second light-emitting diodes ED1 and ED2 respectively located in the first and second display areas DA1 and DA2 have substantially the same arrangement with the first and second separation areas IVA1 and IVA2 therebetween, luminances of the first display area DA1 and the second display area DA2 may be uniform, thereby suppressing image quality deviation.

The second light-emitting diode ED2 electrically connected to the second sub-pixel circuit PC2 may be located in the second display area DA2, and the first light-emitting diode ED1 electrically connected to the first sub-pixel circuit PC1 may be located in the first display area DA1. In one or more embodiments, the first and second light-emitting diodes ED1 and ED2 may include organic light-emitting diodes.

In one or more embodiments, FIG. 8B illustrates first through third organic light-emitting diodes OLED1, OLED2, and OLED3 respectively located in the first sub-pixel circuit areas PCA1, and first through third organic light-emitting diodes OLED1', OLED2', and OLED3' respectively located in the second sub-pixel circuit areas PCA2. For example, the first organic light-emitting diodes OLED1 and OLED1' may be located in the red sub-pixels R and may emit red light, the second organic light-emitting diodes OLED2 and OLED2' may be located in the green sub-pixels G and may emit green light, and the third organic light-emitting diodes OLED3 and OLED3' may be located in the blue sub-pixels B and may emit blue light.

According to some embodiments, the second light-emitting diode ED2 electrically connected to the second sub-pixel circuit PC2 may be located in the second sub-pixel circuit area PCA2, and the first light-emitting diode ED1 electrically connected to the first sub-pixel circuit PC1 may be located in the first sub-pixel circuit area PCA1. In other words, the first through third organic light-emitting diodes OLED1, OLED2, and OLED3 corresponding to the first light-emitting diode ED1 may be located only in the first sub-pixel circuit areas PCA1, and the first through third organic light-emitting diodes OLED1', OLED2', and OLED3 corresponding to the second light-emitting diode ED2 may be located only in the second sub-pixel circuit areas PCA2. Accordingly, a ratio of the first and second separation areas IVA1 and IVA2 per unit area may be increased.

Also, sub-pixel circuits located in two adjacent sub-pixel circuit areas may be electrically connected to each other by signal lines extending in the first direction (e.g., x direction) and/or the second direction (e.g., y direction) perpendicular to the first direction. The signal lines may include a data line or a scan line, and a plurality of sub-pixel circuits may be electrically connected to the data line and the scan line. For example, the signal lines may include the first scan line SWL, the second scan line SIL, the emission control line EL, the initialization voltage line VIL, the electrode voltage line HL, the data line DL, and the driving voltage line PL. The first scan line SWL, the second scan line SIL, the emission control line EL, the initialization voltage line VIL, and the electrode voltage line HL may extend in the first direction (x direction). The data line DL and the driving voltage line PL may extend in the second direction (y direction) perpendicular to the first direction.

In the first and second display areas DA1 and DA2, signal lines may pass through two adjacent sub-pixel circuit areas, and may extend across a separation area. For example, signal lines electrically connected to the first sub-pixel circuits PC1 may extend across the first separation area IVA1 in the first direction and/or the second direction, and signal lines electrically connected to the second sub-pixel circuits PC2 may extend across the second separation area IVA2 in the first direction and/or the second direction.

In the second display area DA2, the first separation area IVA1 may include the transmissive area TA. That is, the transmissive area TA of the second display area DA2 is a portion other than a portion of the first separation area IVA1 where signal lines extending across the first separation area IVA1 are located. The first separation area IVA1 is an area where the sub-pixel circuit PC and the first through third organic light-emitting diodes OLED1, OLED2, and OLED3 are not located. However, when signal lines are formed of a metal layer, light may not be transmitted through the first separation area IVA1 in which the signal lines are located. Accordingly, a portion of the first separation area IVA1 where signal lines are not located may be the transmissive area TA. A wavelength, such as light or sound may be transmitted through the transmissive area TA. A transmittance of the transmissive area TA may be about 20% or more.

Figure 9:
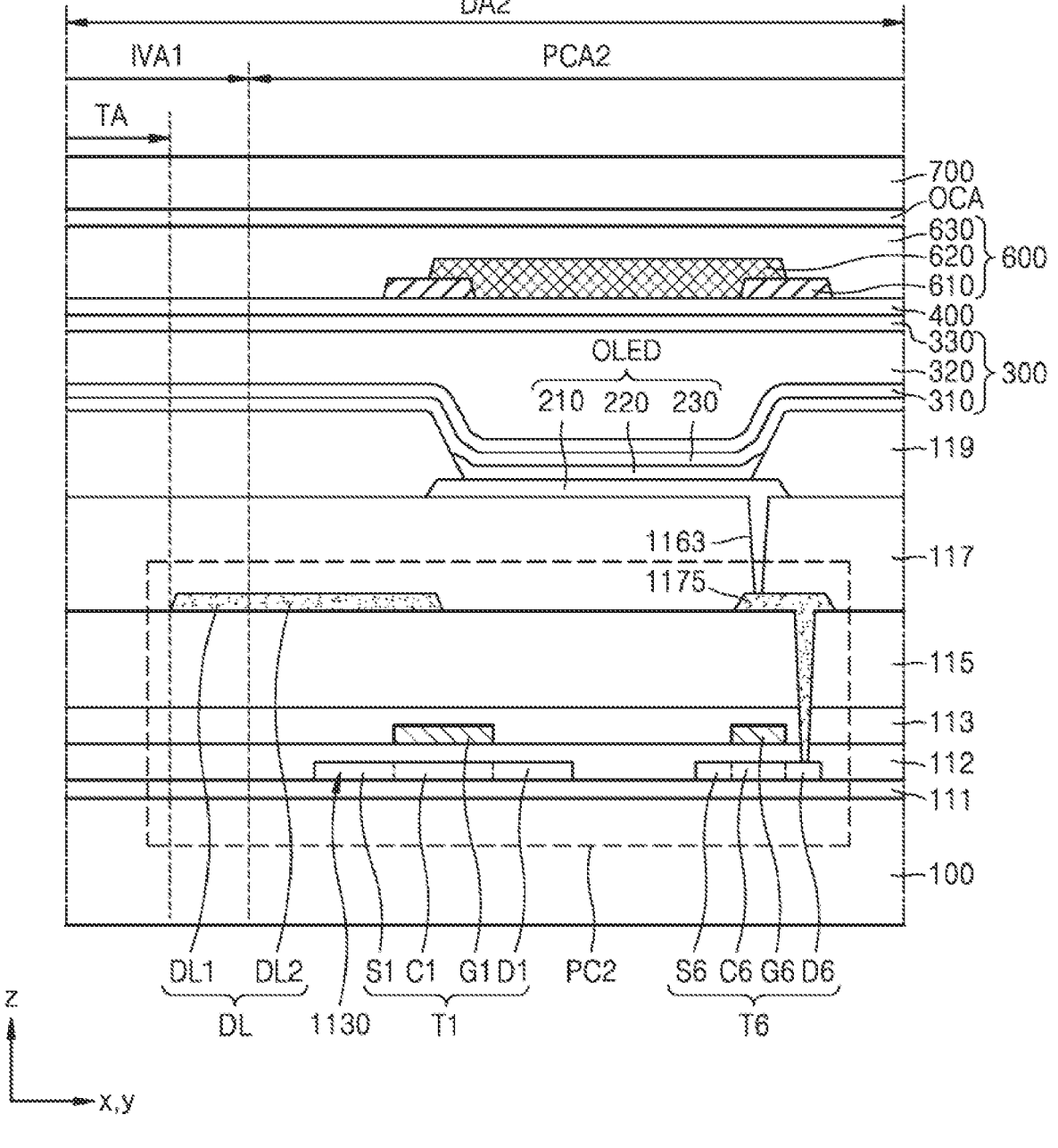
FIG. 9 is a cross-sectional view illustrating a sub-pixel circuit of FIG. 8B and a light-emitting diode connected to the sub-pixel circuit.

FIG. 9 is a cross-sectional view illustrating a part of a second display area of FIG. 8B. In one or more embodiments, in FIG. 9, a light-emitting diode includes an organic light-emitting diode OLED.

Referring to FIG. 9, the second sub-pixel circuit PC2 may be located on the substrate 100, and the organic light-emitting diode OLED may be located on the second sub-pixel circuit PC2.

The substrate 100 may include a glass material or a polymer resin as described above. The buffer layer 111 may be located on the substrate 100, and may reduce or prevent penetration of a foreign material, moisture, or external air from the bottom of the substrate 100, and may planarize the substrate 100. The buffer layer 111 may include an inorganic material, such as oxide or nitride, an organic material, or a combination of an organic material and an inorganic material, and may have a single or multi-layer structure including an inorganic material and an organic material.

The semiconductor layer 1130 may be located on the buffer layer 111. The semiconductor layer 1130 may include a source region (or a source electrode), a drain region (or a drain electrode), and a channel region between the source region and the drain region of each transistor as described with reference to FIG. 5. In one or more embodiments, FIG. 9 illustrates the driving source electrode S1 and the driving drain electrode D1 on respective sides and the driving channel region C1 of the driving transistor T1, and illustrates the emission control source electrode S6, the emission control drain electrode D6, and the emission control channel region C6 of the emission control transistor T6. The semiconductor layer 1130 may include polysilicon, amorphous silicon, an oxide semiconductor, or an organic semiconductor.

A first insulating layer 112 may be located on the semiconductor layer 1130. The first insulating layer 112 that is a gate insulating layer may electrically insulate gate electrodes on the first insulating layer 112 (e.g., the driving gate electrode G1 and the emission control gate electrode G6) from the semiconductor layer 1130 located under the gate electrodes. The first insulating layer 112 may include silicon oxide, silicon nitride, or silicon oxynitride.

The driving gate electrode G1 of the driving transistor T1 and the emission control gate electrode G6 of the emission control transistor T6 may be covered by a second insulating layer 113 and a third insulating layer 115 to electrically insulate a connection metal 1175 from the driving gate electrode G1 and the emission control gate electrode G6. Each of the second insulating layer 113 and the third insulating layer may include silicon oxide, silicon nitride, or silicon oxynitride.

The data line DL and the connection metal 1175 may be located on the third insulating layer 115, and the connection metal 1175 may be electrically connected to a first electrode 210 through a contact hole 1163 of a fourth insulating layer 117 located between the connection metal 1175 and the first electrode 210. The data line DL and the driving voltage line PL (see FIG. 8B) may be formed on the same layer as, and may use the same material as, the connection metal 1175. The data line DL may include a data line first portion DL1 located in the separation area IVA, and a data line second portion DL2 located in the second sub-pixel circuit area PCA2. Referring to FIG. 9, the data line first portion DL1 and the data line second portion DL2 may be formed of the same material as that of the connection metal 1175, and may include a metallic material.

The fourth insulating layer 117 may include an inorganic insulating material, such as silicon oxide or silicon nitride and/or an organic insulating material. The organic insulating material may include benzocyclobutene (BCB), polyimide, hexamethyldisiloxane (HMDSO), a general-purpose polymer, such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The first electrode 210 may be a reflective electrode. In some embodiments, the first electrode 210 may have a multi-layer structure including a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first electrode 210 may have a stacked structure including ITO/Ag/ITO.

A bank layer 119 may have/define an opening portion through which a central portion of the first electrode 210 is exposed to define an emission area of the organic light-emitting diode OLED. In some embodiments, a size and a width of the opening portion may correspond to a size and a width of the emission area, that is, a sub-pixel.

The bank layer 119 may increase a distance between an edge of the first electrode 210 and a second electrode 230 located over the first electrode 210, and may reduce or prevent the likelihood of an arc or the like occurring on the edge of the first electrode 210. The bank layer 119 may include a transparent material (e.g., a transparent organic insulating material). The bank layer 119 may include polyimide, for example, photosensitive polyimide (PI). Alternatively, the bank layer 119 may include an organic insulating material, such as polyamide, acrylic resin, benzocyclobutene, hexamethyldisiloxane (HMDSO), or phenolic resin.

An emission layer 220 may include an organic material including a fluorescent or phosphorescent material that emits red, green, or blue light. In one or more embodiments, a functional layer may be located under/over the emission layer 220. The functional layer may include a hole transport layer, a hole injection layer, an electron injection layer, and/or an electron transport layer.

The second electrode 230 may be a light-transmitting electrode. The second electrode 230 may be formed of a metal thin film having a low work function including Li, Ca, LiF/Ca, LiF/Al, Al, Ag, Mg, or a compound thereof. Also, a transparent conductive oxide (TCO) film including ITO, IZO, ZnO, or $In_2O_3$ may be further located on the metal thin film. The second electrode 230 may be formed to entirely cover the display area DA.

Referring to FIGS. 8B and 9, semiconductor layer(s) of transistors, electrodes of the transistors, an electrode of a storage capacitor, and conductive lines may be located between the substrate 100 and the bank layer 119. At least two selected from among the semiconductor layer(s), the electrodes, the conductive lines, and the first electrode 210 may overlap each other, and an overlapping portion corresponds to an area where light may not be transmitted. In contrast, as shown in FIGS. 8B and 9, when the substrate 100 is viewed in a direction perpendicular to the substrate 100, an area (hereinafter, referred to as the transmissive area TA) where the semiconductor layer(s), the electrodes, the conductive lines, and the first electrode 210 do not overlap each other, may correspond to an area where light may be transmitted.

The transmissive area TA may have a stacked structure including only the bank layer 119, and an insulating layer between the substrate 100 and the bank layer 119. For example, in the transmissive area TA, the buffer layer 111, the first through fourth insulating layers 112, 113, 115, and 117, and the bank layer 119 may be stacked. In other words, layers including a material for reflecting or blocking light, for example, the semiconductor layer, the electrode, the conductive lines, and the first electrode 210, are not located in the transmissive area TA.

The organic light-emitting diode OLED may be covered by the encapsulation layer 300. The encapsulation layer 300 may include the first and second inorganic encapsulation layers 310 and 330, and the organic encapsulation layer 320 between the first and second inorganic encapsulation layers 310 and 330.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by using chemical vapor deposition.

The organic encapsulation layer 320 may include a polymer-based material. Examples of the polymer-based material may include an acrylic resin, an epoxy resin, polyimide, and polyethylene. For example, the organic encapsulation layer 320 may include an acrylic resin, such as polymethyl methacrylate or polyacrylic acid. The organic encapsulation layer 320 may be formed by curing a monomer or applying a polymer.

The input sensing layer 400 may be located on the encapsulation layer 300. The input sensing layer 400 may obtain coordinate information according to an external input, for example, a touch event of an object, such as a finger or a stylus pen. To this end, the input sensing layer 400 may include a touch electrode, trace lines connected to the touch electrode, and an insulating layer for insulating them.

The anti-reflection layer 600 that is an optical functional layer may be located on the input sensing layer 400. The anti-reflection layer 600 may include a black matrix 610, a color filter 620, and an overcoat layer 630.

The color filter 620 may be located in the emission area of the organic light-emitting diode OLED. The color filter 620 may include a red, green, or blue pigment or dye according to a color of light emitted by the organic light-emitting diode OLED. The color filter 620 may be arranged in consideration of a color of light emitted by each of sub-pixels of the display panel 10.

The black matrix 610 may be located in a non-emission area around the emission area and may surround the emission area. The black matrix 610 may include an insulating material (e.g., an organic insulating material) including a black pigment or a black dye.

The overcoat layer 630 for covering the black matrix 610 and the color filter 620 to planarize a top surface thereof may be located thereon. The overcoat layer 630 may include an organic material, such as a resin, and the organic material may be transparent.

When the anti-reflection layer 600 includes the black matrix 610 and the color filters 620 as shown in FIG. 9, a light-transmitting material may be located at a position corresponding to the transmissive area TA. The anti-reflection layer 600 may include the overcoat layer 630 corresponding to the transmissive area TA. The overcoat layer 630 may include a light-transmitting organic insulating material.

Figure 10:
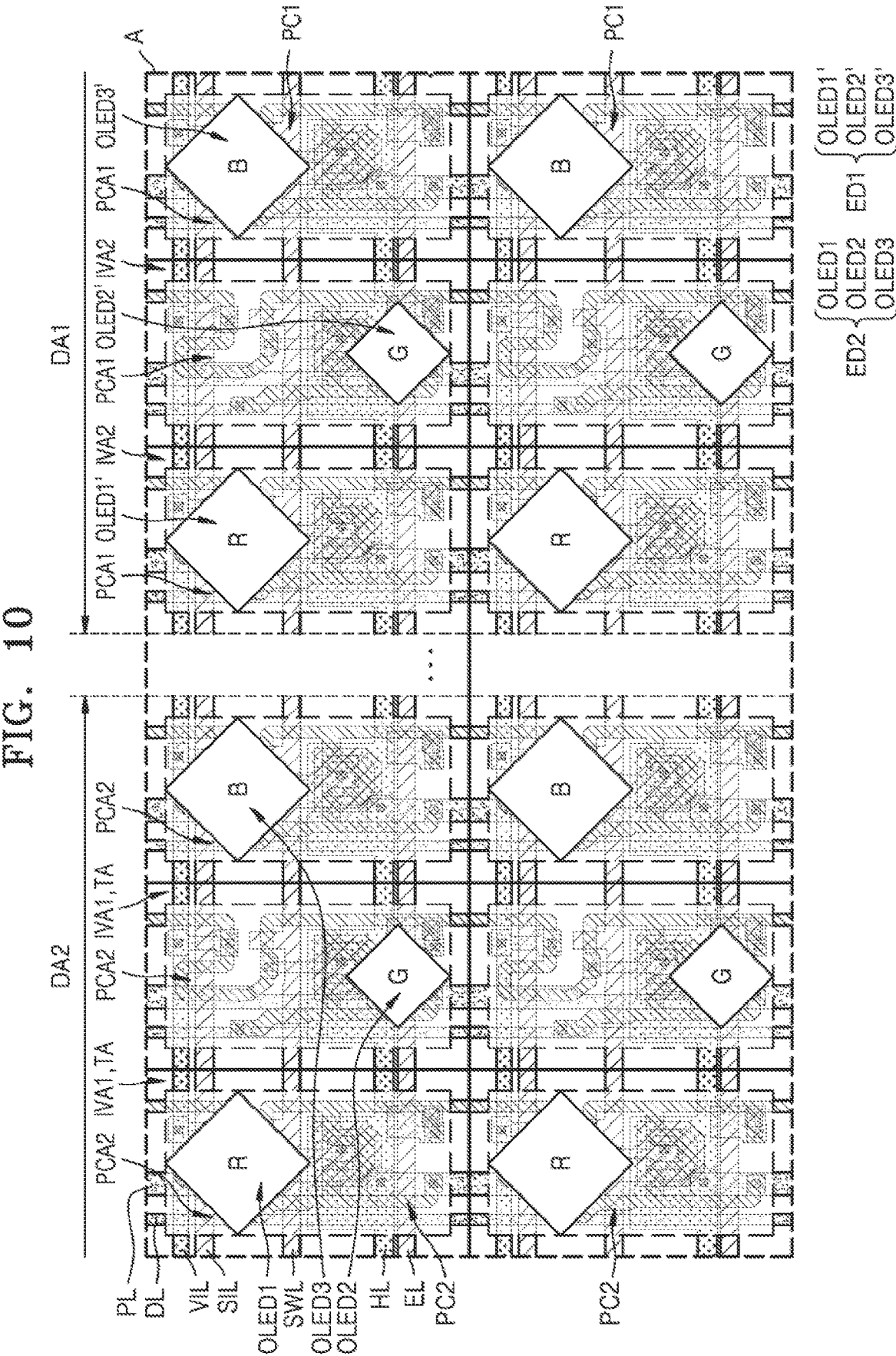
FIG. 10 is a plan view schematically illustrating a display panel, according to one or more other embodiments.

FIG. 10 is a plan view schematically illustrating a display panel, according to one or more other embodiments. Referring to FIG. 10, although shapes of the first and second separation areas IVA1 and IVA2 and arrangements of the first and second sub-pixel circuit areas PCA1 and PCA2 and the first and second separation areas IVA1 and IVA2 are different, other features are the same as those described with reference to FIGS. 8A and 8B. In FIG. 10 and FIGS. 8A and 8B, the same elements are denoted by the same reference numerals, and a repeated explanation thereof will not be given, and the following will focus on one or more differences therebetween.

The first sub-pixel circuit area PCA1 is an area where the first sub-pixel circuit PC1 is located, and the second sub-pixel circuit area PCA2 is an area where the second sub-pixel circuit PC2 is located.

The second separation area IVA2 at least partially surrounding the first sub-pixel circuit area PCA1 is an area where electronic elements, such as a transistor, a capacitor, and/or a diode are not located, unlike the first sub-pixel circuit area PCA1. The first separation area IVA1 at least partially surrounding the second sub-pixel circuit area PCA2 is an area where electronic elements, such as a transistor, a capacitor, and/or a diode are not located, unlike the second sub-pixel circuit area PCA2. In one or more embodiments, in FIG. 10, the second separation areas IVA2 entirely surround all side surfaces of the first sub-pixel circuit areas PCA1 in a plan view, and the first separation areas IVA1 surround all side surfaces of the second sub-pixel circuit areas PCA2 in a plan view.

As shown in FIG. 10, the first sub-pixel circuit area PCA1 may be arranged to form rows and columns in the first display area DA1, and the second separation area IVA2 may be located between adjacent first sub-pixel circuit areas PCA1. The second sub-pixel circuit area PCA2 may be arranged to form rows and columns in the second display area DA2, and the first separation area IVA1 may be located between adjacent second sub-pixel circuit areas PCA2.

Also, in a plan view, shapes of a plurality of first separation areas IVA1 located in the second display area DA2 may be substantially the same as shapes of a plurality of second separation areas IVA2 located in the first display area DA1. Per unit area, a proportion of the second display area DA2 occupied by the plurality of first separation areas IVA1 may be the same as a proportion of the first display area DA1 occupied by the plurality of second separation areas IVA2.

In the display panel having the above structure according to one or more other embodiments, because the first separation areas IVA1 of the second display area DA2 surround all side surfaces of the second sub-pixel circuit areas PCA2, transmittances of sub-pixel unit areas of the second display area DA2 may be uniform. Also, because shapes and arrangements of the sub-pixel circuit areas PCA and the separation areas IVA may be the same in the first display area DA1 and the second display area DA2, luminances of the first display area DA1 and the second display area DA2 may be uniform, thereby suppressing image quality deviation.

Figure 11:
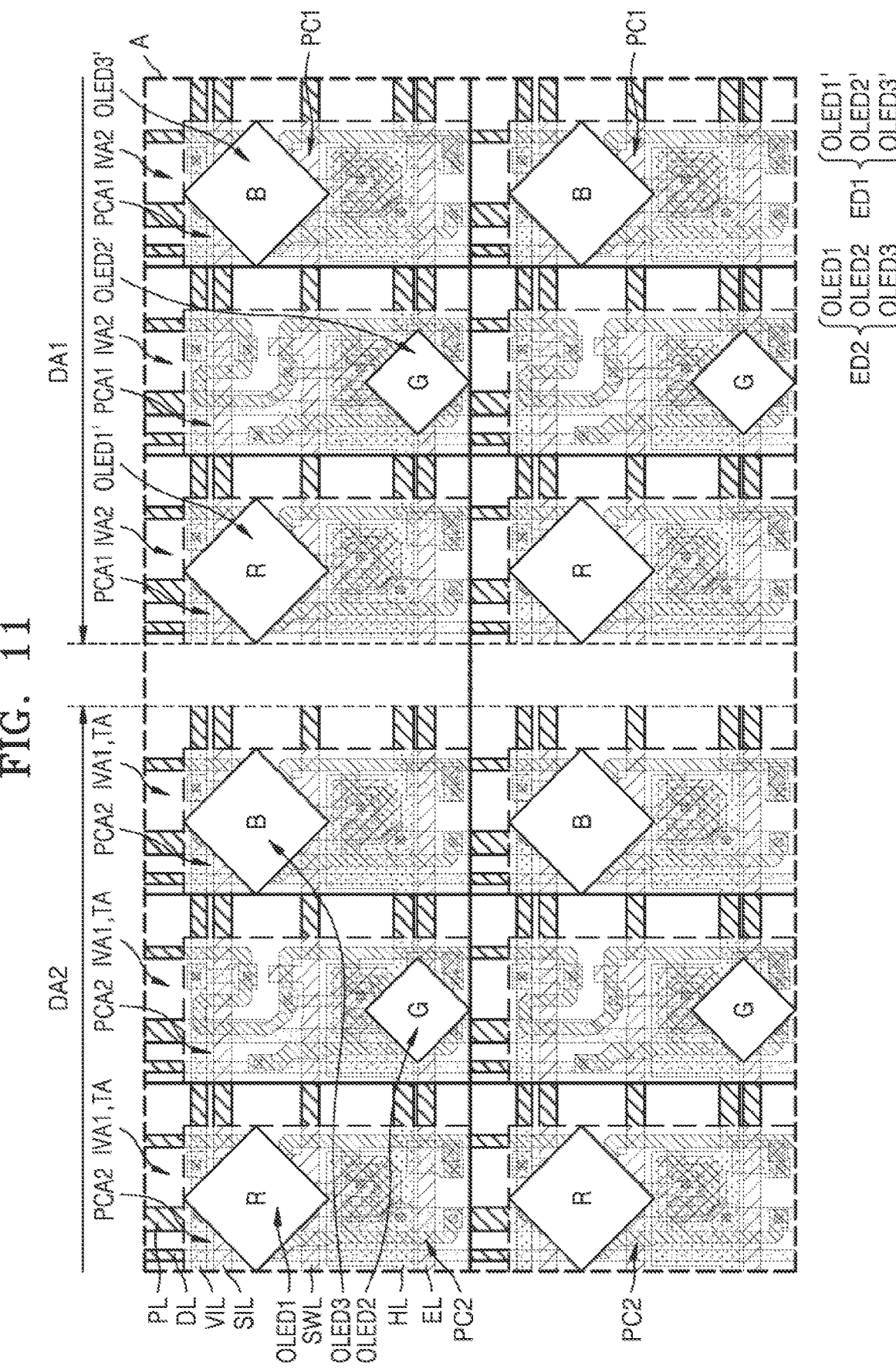
FIG. 11 is a plan view schematically illustrating a display panel, according to one or more other embodiments.
Figure 12:
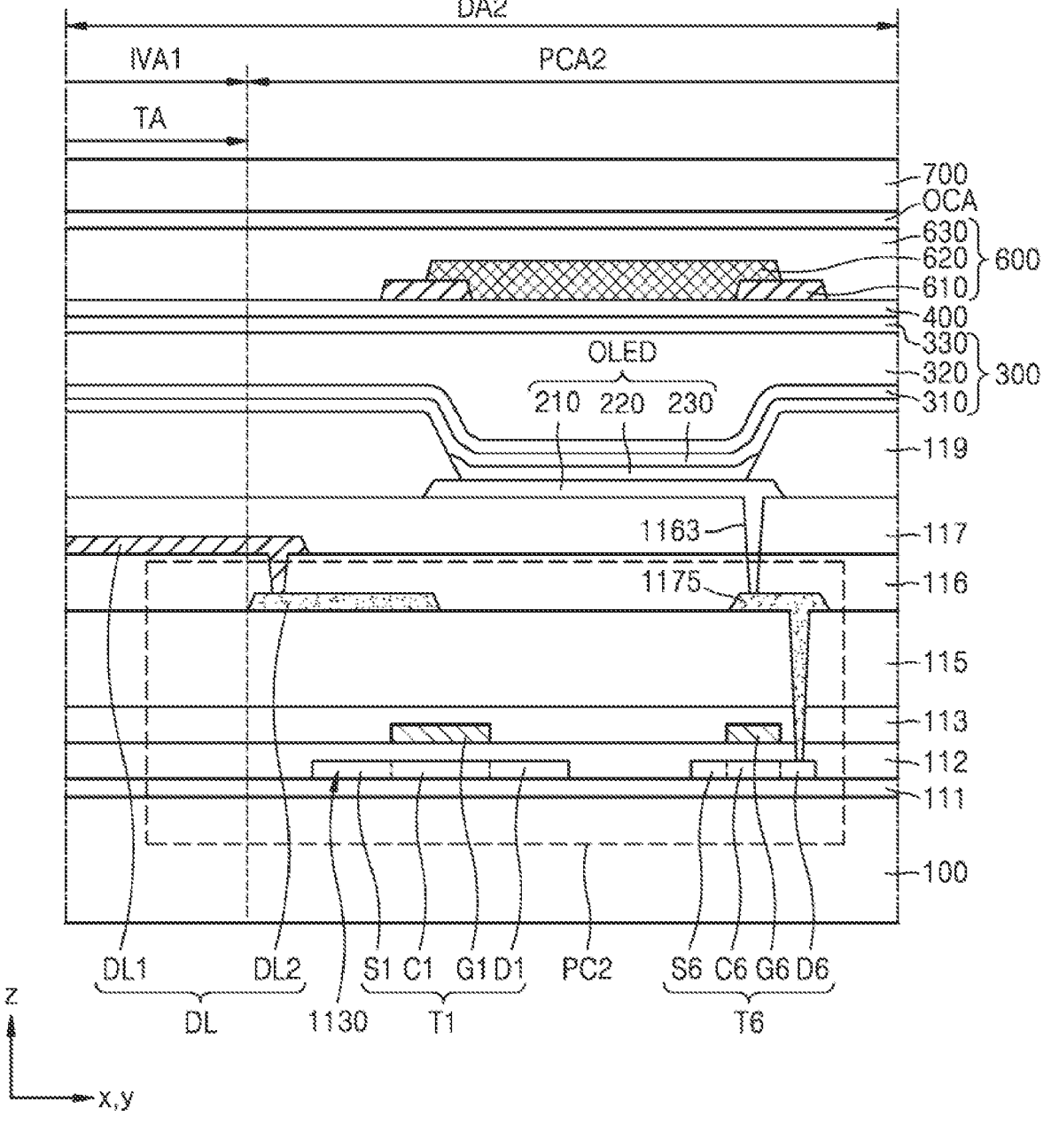
FIG. 12 is a cross-sectional view illustrating a sub-pixel circuit of FIG. 11 and a light-emitting diode connected to the sub-pixel circuit.

FIG. 11 is a plan view schematically illustrating a display panel, according to one or more other embodiments. FIG. 12 is a cross-sectional view illustrating a sub-pixel circuit of a display panel and a light-emitting diode connected to the sub-pixel circuit, according to one or more other embodiments. Referring to FIGS. 11 and 12, features other than signal lines are the same as those described with reference to FIGS. 8A, 8B, and 9. In FIGS. 11 and 12 and FIGS. 8B and 9, the same elements are denoted by the same reference numerals and a repeated description thereof will not be given, and the following will focus on a difference.

Sub-pixel circuits respectively located in two adjacent sub-pixel circuit areas may be electrically connected to each other by signal lines extending in the first direction (e.g., x direction), or in the second direction (e.g., y direction) perpendicular to the first direction. In detail, the second sub-pixel circuits PC2 located in two adjacent second sub-pixel circuit areas PCA2 may be electrically connected to each other by extending signal lines, and the first sub-pixel circuits PC1 located in two adjacent first sub-pixel circuit areas PCA1 may be electrically connected to each other by extending signal lines. The signal lines may include a data line or a scan line, and the first and second sub-pixel circuits PC1 and PC2 may be electrically connected to the data line and the scan line.

The signal lines may extend across a separation area to electrically connect two adjacent sub-pixel circuit areas. Signal lines for electrically connecting the second sub-pixel circuits PC2 located in the second sub-pixel circuit areas PCA2 in the second display area DA2 may be located in the first separation area IVA1, and signal lines for electrically connecting the first sub-pixel circuits PC1 located in the first sub-pixel circuit areas PCA1 in the first display area DA1 may be located in the second separation area IVA2.

However, referring to FIGS. 11 and 12, in the display panel according to one or more other embodiments, the data lines DL may be located on different layers to be electrically connected to each other through a contact hole. In detail, the data line DL may include the data line first portion DL1 located in the first and second separation areas IVA1 and IVA2, and the data line second portion DL2 located in the first and second sub-pixel circuit areas PCA1 and PCA2. Also, an insulating layer that may be located between the third insulating layer 115 and the organic light-emitting diode OLED may be divided into the fourth insulating layer 117 and a fifth insulating layer 116. In this case, the data line second portion DL2 may be located on the third insulating layer 115 and may be covered by the fifth insulating layer 116, and the data line first portion DL1 may be located on the fifth insulating layer 116 and may be covered by the fourth insulating layer 117. Because the data line first portion DL1 and the data line second portion DL2 are located on different layers, the data line first portion DL1 and the data line second portion DL2 may be electrically connected to each other through a contact hole of the fifth insulating layer 116 located between the data line first portion DL1 and the data line second portion DL2.

The data line second portion DL2 located in the first and second sub-pixel circuit areas PCA1 and PCA2 may be formed on the same layer as, and using the same material as, the connection metal 1175, and may include a metallic material. The data line first portion DL1 located in the first and second separation areas IVA1 and IVA2 may include a transparent conductive material. The data line first portion DL1 that is a transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Because the data line second portion DL2 located in the first and second sub-pixel circuit areas PCA1 and PCA2 includes a metallic material, like in the related art, while the data line first portion DL1 located in the first and second separation areas IVA1 and IVA2 includes a transparent conductive material, however, light may be transmitted even to the data line located in the first and second separation areas IVA1 and IVA2. Referring to FIG. 11, the feature that a transparent conductive material is included in a portion of the data line DL located in the first and second separation areas IVA1 and IVA2 may be applied to all signal lines extending across the first and second separation areas IVA1 and IVA2. Accordingly, because signal lines located in the first separation area IVA1 of the second display area DA2 are light transmissive, the transmissive area TA of the first separation area IVA1 may include even a portion where the signal lines are located.

In the display panel having the above structure according to one or more other embodiments, because signal lines located in the first separation area IVA1 of the second display area DA2 include a transparent conductive material, a transmittance of the second display area DA2 may be further increased. That is, when a signal line in the first separation area IVA1 of the second display area DA2 is formed of a metal material, only the first separation area IVA1 other than a portion where the signal line is located may be the transmissive area TA. However, when signal lines located in the first separation area IVA1 are light transmissive, even a portion where the signal lines are located may be the transmissive area TA, thereby increasing the area of the transmissive area TA. In addition, because shapes and arrangements of the sub-pixel circuit area PCA and the separation area IVA may be the same in the first display area DA1 and the second display area DA2, luminances of the first display area DA1 and the second display area DA2 may be substantially uniform.

According to embodiments, a display panel capable of providing a high-quality image may be provided, a sufficient transmittance of a second display area including a transmissive area may be secured, and image quality deviation between a first display area and the second display area may be reduced or prevented. These aspects are only examples, and do not limit the scope of the disclosure.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by one of ordinary skill in the art that various changes in form and details may be made therein without departing from the spirit and scope as defined by the following claims, with functional equivalents thereof to be included therein.

What is claimed is:

1. A display panel comprising:
   a substrate comprising a first display area, and a second display area inside the first display area and comprising sub-pixel circuit areas, and transmissive areas respectively at least partially surrounding the sub-pixel circuit areas;
   light-emitting diodes in the first display area and in the second display area;
   sub-pixel circuits respectively electrically connected to ones of the light-emitting diodes; and
   a light-transmitting organic insulating material overlapping the transmissive areas,
   wherein two adjacent ones of the sub-pixel circuit areas in the second display area are spaced apart from each other in a first direction with a first separation area therebetween, the first separation area comprising one of the transmissive areas.

2. The display panel of claim 1, wherein the two adjacent ones of the sub-pixel circuit areas are respectively electrically connected to a first light-emitting diode of the light-emitting diodes that emits light of a first color, and to a second light-emitting diode of the light-emitting diodes that emits light of a second color different from the first color.

3. The display panel of claim 2, wherein the first light-emitting diode and the second light-emitting diode respectively overlap corresponding ones of the sub-pixel circuits respectively in the two adjacent ones of the sub-pixel circuit areas.

4. The display panel of claim 1, wherein corresponding ones of the sub-pixel circuits respectively in the two adjacent ones of the sub-pixel circuit areas in the second display area are electrically connected to a signal line extending across the first separation area in the first direction.

5. The display panel of claim 4, wherein the signal line comprises a data line or a scan line.

6. The display panel of claim 4, wherein a first portion of the signal line crossing the first separation area comprises a transparent conductive material.

7. The display panel of claim 6, wherein a second portion of the signal line comprises a metallic material in at least one of the two adjacent ones of the sub-pixel circuit areas, and is electrically connected to the first portion through a contact hole of at least one insulating layer between the first portion and the second portion.

8. The display panel of claim 1, wherein a first number of first light-emitting diodes of the light-emitting diodes in the first display area and a second number of second light-emitting diodes of the light-emitting diodes in the second display area are the same, per unit area.

9. A display panel comprising:
a substrate comprising a first display area, and a second display area inside the first display area and comprising sub-pixel circuit areas, and transmissive areas respectively at least partially surrounding the sub-pixel circuit areas;
light-emitting diodes in the first display area and in the second display area; and
sub-pixel circuits respectively electrically connected to ones of the light-emitting diodes,
wherein two adjacent ones of the sub-pixel circuit areas in the second display area are spaced apart from each other in a first direction with a first separation area therebetween, the first separation area comprising one of the transmissive areas, and
wherein the first display area comprises other sub-pixel circuit areas in which other sub-pixel circuits are respectively located, two adjacent ones of the other sub-pixel circuit areas being spaced apart from each other with a second separation area therebetween.

10. The display panel of claim 9, wherein a first shape of the first separation area and a second shape of the second separation area are the same in a plan view.

11. The display panel of claim 9, wherein a first proportion of the second display area occupied by the first separation area is the same as a second proportion of the first display area occupied by the second separation area, per unit area.

12. An electronic device comprising:
a component; and
a display panel comprising:

a substrate comprising a first display area, and a second display area inside the first display area, overlapping the component, and comprising sub-pixel circuit areas, and transmissive areas respectively at least partially surrounding the sub-pixel circuit areas;
light-emitting diodes in the first display area and in the second display area; and
sub-pixel circuits respectively electrically connected to ones of the light-emitting diodes,
wherein two adjacent ones of the sub-pixel circuit areas in the second display area are spaced apart from each other in a first direction with a first separation area therebetween, the first separation area comprising one of the transmissive areas, and
wherein the first display area comprises other sub-pixel circuit areas in which other sub-pixel circuits are respectively located, two adjacent ones of the other sub-pixel circuit areas being spaced apart from each other with a second separation area therebetween.

13. The electronic device of claim 12, wherein the component comprises a sensor or a camera.

14. The electronic device of claim 12, wherein the two adjacent ones of the sub-pixel circuit areas are respectively electrically connected to a first light-emitting diode of the light-emitting diodes that emits light of a first color, and to a second light-emitting diode of the light-emitting diodes that emits light of a second color different from the first color.

15. The electronic device of claim 14, wherein the first light-emitting diode and the second light-emitting diode respectively overlap corresponding ones of the sub-pixel circuits respectively in the two adjacent ones of the sub-pixel circuit areas.

16. The electronic device of claim 12, wherein corresponding ones of the sub-pixel circuits respectively in the two adjacent ones of the sub-pixel circuit areas in the second display area are electrically connected to a signal line extending in the first direction across the first separation area.

17. The electronic device of claim 16, wherein a first portion of the signal line crossing the first separation area comprises a transparent conductive material.

18. The electronic device of claim 17, wherein a second portion of the signal line comprises a metallic material in at least one of the two adjacent ones of the sub-pixel circuit areas, and is electrically connected to the first portion through a contact hole of at least one insulating layer between the first portion and the second portion.

19. The electronic device of claim 12, wherein a first shape of the first separation area and a second shape of the second separation area are the same in a plan view.

20. The electronic device of claim 12, wherein a first proportion of the second display area occupied by the first separation area is the same as a second proportion of the first display area occupied by the second separation area, per unit area.

* * * * *